United States Patent
Bristol et al.

(10) Patent No.: US 9,530,733 B2
(45) Date of Patent: Dec. 27, 2016

(54) FORMING LAYERS OF MATERIALS OVER SMALL REGIONS BY SELECTIVE CHEMICAL REACTION INCLUDING LIMITING ENCHROACHMENT OF THE LAYERS OVER ADJACENT REGIONS

(71) Applicant: Intel Corporation, Santa Clara, CA (US)

(72) Inventors: Robert L. Bristol, Portland, OR (US); James M. Blackwell, Portland, OR (US); Scott B. Clendenning, Portland, OR (US); Florian Gstrein, Portland, OR (US); Eungnak Han, Beaverton, OR (US); Grant M. Kloster, Lake Oswego, OR (US); Jeanette M. Roberts, Hillsboro, OR (US); Patricio E. Romero, Portland, OR (US); Rami Hourani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/909,736

(22) PCT Filed: Sep. 27, 2013

(86) PCT No.: PCT/US2013/062456
§ 371 (c)(1),
(2) Date: Feb. 2, 2016

(87) PCT Pub. No.: WO2015/047345
PCT Pub. Date: Apr. 2, 2015

(65) Prior Publication Data
US 2016/0190060 A1    Jun. 30, 2016

(51) Int. Cl.
*H01L 23/58*  (2006.01)
*H01L 23/528* (2006.01)
(Continued)

(52) U.S. Cl.
CPC ........... *H01L 23/528* (2013.01); *H01L 21/311* (2013.01); *H01L 21/3105* (2013.01);
(Continued)

(58) Field of Classification Search
CPC ............... H01L 23/528; H01L 21/3105; H01L 21/31058; H01L 21/32051; H01L 21/76801; H01L 21/76816; H01L 21/76829; H01L 21/76849; H01L 21/76877; H01L 23/5226; H01L 23/53295; H01L 2921/0002
See application file for complete search history.

(56) References Cited

U.S. PATENT DOCUMENTS

| 4,963,511 A |  | 10/1990 | Smith |  |
|---|---|---|---|---|
| 6,346,976 B1 | * | 2/2002 | Komeno | G02F 1/136204 349/139 |
| 8,771,929 B2 | * | 7/2014 | Guillorn | B81C 1/00031 430/323 |

(Continued)

OTHER PUBLICATIONS

Notification Concerning of Transmittal of the International Preliminary Report on Patentability for PCT/US2013/062456 filed Sep. 27, 3013, mailing date Apr. 7, 2016, 7 pages.
(Continued)

*Primary Examiner* — Yosef Gebreyesus
(74) *Attorney, Agent, or Firm* — Blakely, Sokoloff, Taylor & Zafman LLP

(57) ABSTRACT

A method of an aspect includes forming a first thicker layer of a first material over a first region having a first surface material by separately forming each of a first plurality of thinner layers by selective chemical reaction. The method also includes limiting encroachment of each of the first plurality of thinner layers over a second region that is adjacent to the first region. A second thicker layer of a second material is formed over the second region having a second surface material that is different than the first surface material.

20 Claims, 13 Drawing Sheets

(51) Int. Cl.
*H01L 21/32* (2006.01)
*H01L 21/768* (2006.01)
*H01L 21/3105* (2006.01)
*H01L 21/311* (2006.01)
*H01L 21/3205* (2006.01)
*H01L 23/522* (2006.01)
*H01L 23/532* (2006.01)
*H01L 21/321* (2006.01)

(52) U.S. Cl.
CPC ........ *H01L 21/31058* (2013.01); *H01L 21/32* (2013.01); *H01L 21/32051* (2013.01); *H01L 21/76801* (2013.01); *H01L 21/76816* (2013.01); *H01L 21/76829* (2013.01); *H01L 21/76832* (2013.01); *H01L 21/76849* (2013.01); *H01L 21/76877* (2013.01); *H01L 23/5226* (2013.01); *H01L 23/53295* (2013.01); *H01L 21/321* (2013.01); *H01L 2924/0002* (2013.01)

(56) References Cited

U.S. PATENT DOCUMENTS

| | | | |
|---|---|---|---|
| 2003/0227584 A1* | 12/2003 | Onozuka | G02F 1/136286 349/61 |
| 2010/0032845 A1 | 2/2010 | Usami | |
| 2010/0200900 A1 | 8/2010 | Iwayama | |
| 2012/0326313 A1 | 12/2012 | Uzoh et al. | |
| 2013/0175639 A1 | 7/2013 | Becker et al. | |
| 2014/0099583 A1* | 4/2014 | Holmes | G03F 7/0002 430/326 |
| 2014/0370718 A1* | 12/2014 | Chakrapani | H01L 21/67103 438/725 |

OTHER PUBLICATIONS

Notification of Transmittal of the International Search Report and the Written Opinion of the International Searching Authority for PCT/US2013/062456 filed Sep. 27, 3013, mailing date Jun. 30, 2014, 12 pages.

* cited by examiner

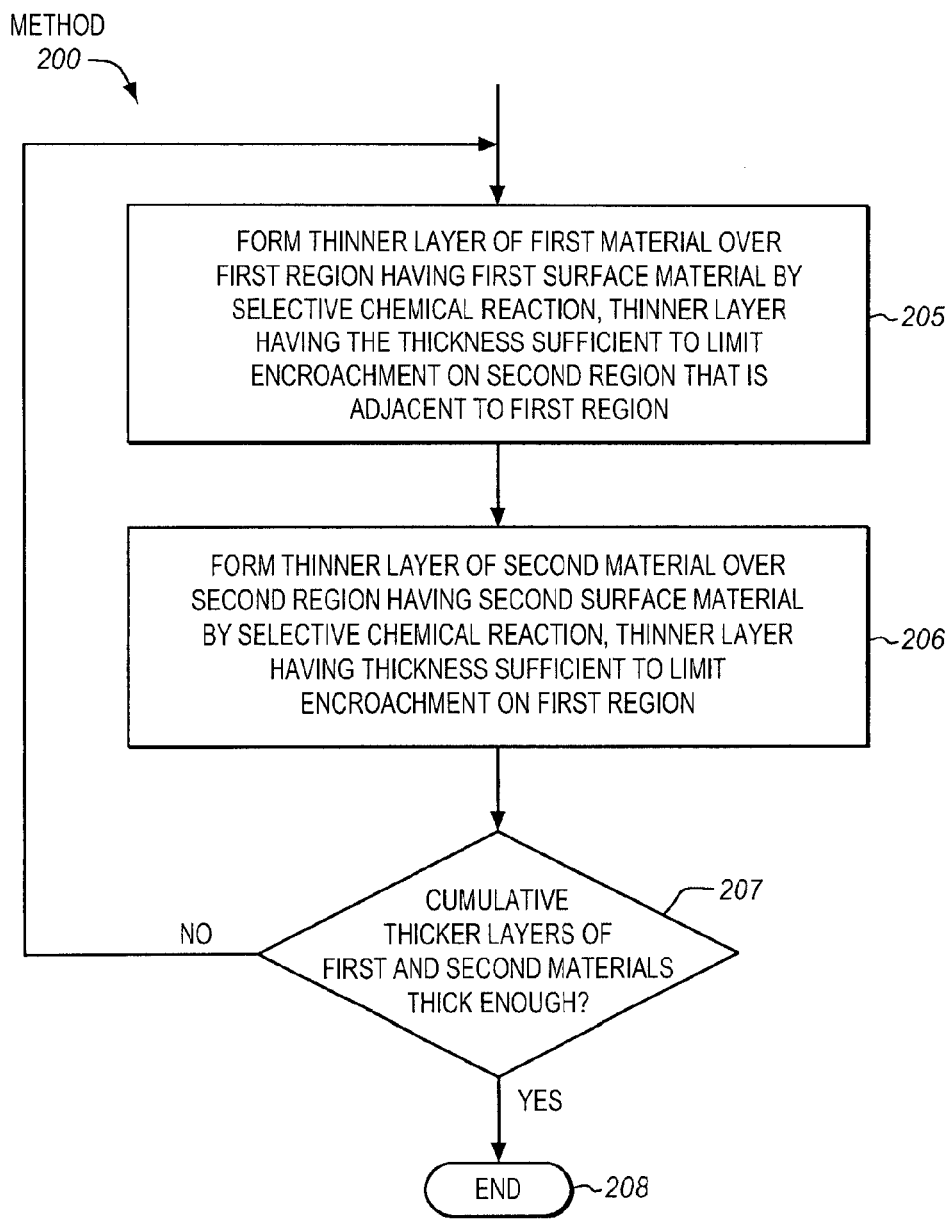

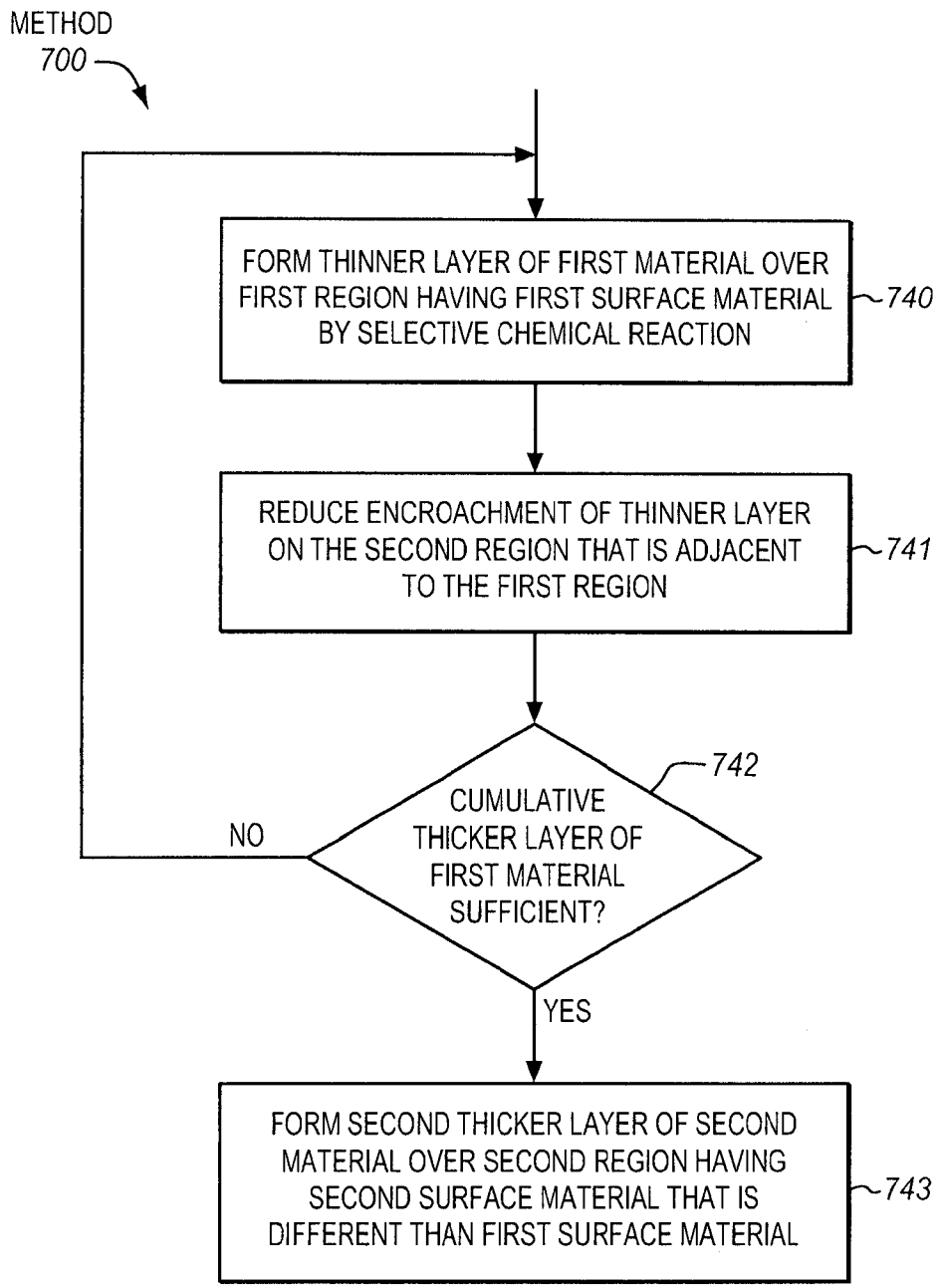

FORMING LAYERS OF MATERIALS OVER SMALL REGIONS BY SELECTIVE CHEMICAL REACTION INCLUDING LIMITING ENCHROACHMENT OF THE LAYERS OVER ADJACENT REGIONS

This patent application is a U.S. National Phase application under 35 U.S.C. 371 of International Application No. PCT/US2013/062456 filed Sep. 27, 2013.

BACKGROUND

Technical Field

Embodiments described herein generally relate to forming layers of materials over small regions of substrates. In particular, embodiments described herein generally relate to forming layers of materials over small regions of substrates by selective or at least preferential chemical reaction.

Background Information

Integrated circuits generally include interconnect structures to electrically couple circuitry formed in a semiconductor substrate (e.g., transistors and other circuit elements) with an external signaling medium (e.g., a package, pins, printed circuit board, etc.). Often multi-layer interconnect structures are employed that include multiple levels of generally coplanar metal or other interconnect lines disposed within a dielectric or insulating layer. Vias are generally used to provide select electrical couplings between interconnect lines on different levels by providing electrically conductive paths through the dielectric or insulating materials between the interconnect lines on the different levels.

The metal lines and vias are typically formed by a process that uses lithographic patterning to define their locations and dimensions. In the case of copper interconnect lines commonly found in many modern day processors a dual damascene type of process is generally employed. Representatively, in one such process, a photoresist layer may be spin coated over a dielectric layer over a substrate, often with thin hard mask layer in between to facilitate etch transfer. Openings for the vias may initially be patterned in the photoresist layer by exposing the photoresist layer to patterned actinic radiation through one or more patterned masks and developing the photoresist layer to form the openings for the vias. The lithographically defined openings for the vias may then be used as an etch mask to etch openings for the vias in the underlying dielectric layer. Subsequently, openings for the metal lines may similarly be formed lithographically in the photoresist layer. The lithographically defined openings for the metal lines may be used as an etch mask to etch trenches or line openings for the metal lines in the underlying dielectric layer. Metal (e.g., one or more barrier layers, bulk copper, etc.) may be introduced into the openings for the vias and the metal lines that have been formed in the dielectric layer. Chemical mechanical polishing (CMP) is commonly used to remove excess metal residing outside of the metal lines. Such a process may generally be repeated to form the additional overlying levels of vias and interconnect lines. Generally, lithography is used to position and align the vias and interconnect lines of an upper/overlying level relative to those on the adjacent lower/underlying level.

There has been a general past and present trend toward ever decreasing sizes and spacing of interconnect structures for at least certain types of integrated circuits (e.g., processors, chipset components, graphics chips, other advanced integrated circuits, etc.). It is likely that in the future the sizes and spacing of interconnect structures will continue to progressively decrease. One measure of the size of the interconnect structures is their critical dimensions (e.g., the line widths and/or the widths of the via openings). One measure of the spacing of interconnects is pitch (e.g., the line pitch and/or the via pitch). The pitch may represent the center-to-center distance between the closest adjacent interconnect structures (e.g., adjacent lines or adjacent vias).

When patterning extremely small interconnect structures and/or interconnect structures at extremely small pitches by such lithographic processes, several challenges tend to present themselves, especially when the pitches are around 50 nanometers (nm) or less and/or when the critical dimensions of the lines and/or vias are around 20 nm or less. For one thing, the overlay between the vias and the overlying interconnects, and the overlay between the vias and the underlying landing interconnects, both generally need to be controlled to high tolerances. As pitches (e.g., via pitches) scale ever smaller over time, the overlay tolerances tend to scale with them at a generally greater rate than lithographic equipment is able to keep up. Moreover, the critical dimensions of the openings (e.g., via openings) tend to scale faster than the resolution capabilities of the lithographic scanners. Shrink technologies exist to shrink the critical dimensions of the openings. However, the shrink amount tends to be limited by the minimum pitch, as well as by the ability of the shrink process to be sufficiently optical proximity correction (OPC) neutral, and to not significantly compromise line width roughness (LWR) and/or critical dimension uniformity (CDU). Further, the LWR and/or CDU characteristics of photoresists generally need to improve as the critical dimensions decrease in order to maintain the same overall fraction of the critical dimension budget. However, currently the LWR and/or CDU characteristics of many photoresists are not improving as rapidly as the critical dimensions are decreasing.

BRIEF DESCRIPTION OF THE DRAWINGS

The invention may best be understood by referring to the following description and accompanying drawings that are used to illustrate embodiments of the invention. In the drawings:

FIG. 2 is a block flow diagram of an embodiment of a method of forming first and second thicker layers over respective first and second adjacent regions that includes alternating between forming thinner layers of each of the first and second thicker layers.

FIG. 7 is a block flow diagram of an embodiment of a method of forming first and second thicker layers of first and second materials over respective first and second adjacent regions that includes alternating between forming thinner layers of the first material and reducing lateral encroachment of the thinner layers of the first material over the adjacent second region.

DETAILED DESCRIPTION OF EMBODIMENTS

Disclosed herein are methods and apparatus for forming layers of materials over small regions of substrates by selective chemical reaction that include limiting encroachment of the layers over adjacent regions. In some embodiments, the methods and apparatus may be used to form vias, interconnect structures, small microelectronic structures, or other small structures. In the following description, numerous specific details are set forth (e.g., specific types of structures, materials, reactions, material deposition and removal approaches, orders of operations, and the like). However, it is understood that embodiments of the invention may be practiced without these specific details. In other instances, well-known circuits, structures and techniques have not been shown in detail in order not to obscure the understanding of this description.

Figure 1:
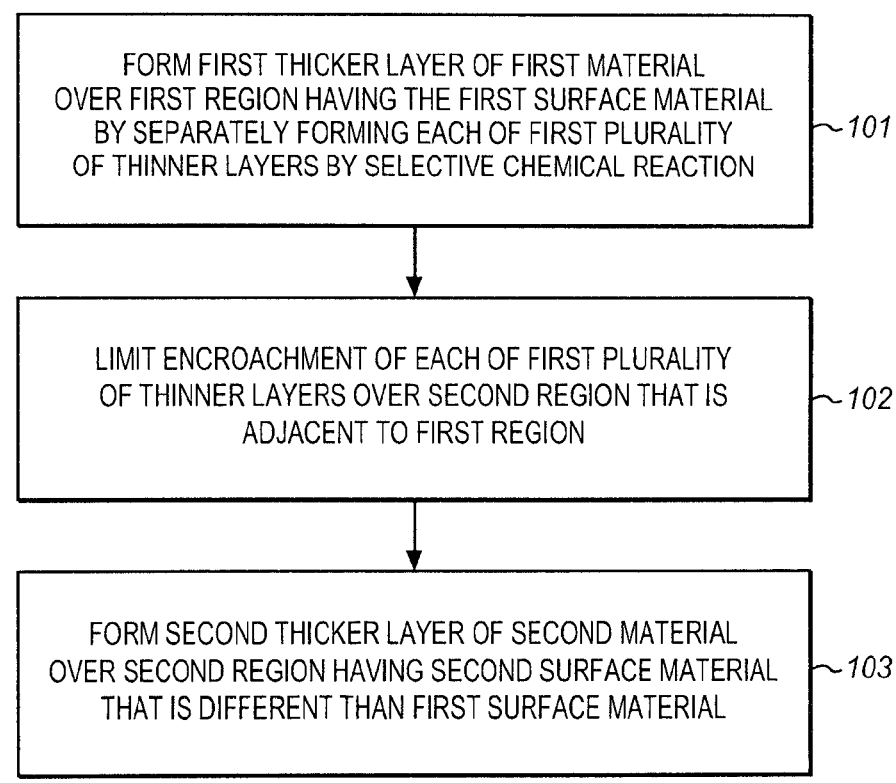
FIG. 1 is a block flow diagram of an embodiment of a method of forming first and second thicker layers of first and second materials over respective first and second adjacent regions that includes limiting encroachment of the first thicker layer over the second region.

FIG. 1 is a block flow diagram of an embodiment of a method 100 of forming first and second thicker layers of first and second materials over respective first and second adjacent regions that includes limiting encroachment of the first thicker layer over the second region. In some embodiments, the first and second thicker layers may be used to form vias, interconnect structures, microelectronic structures, or other small structures.

The method includes forming the first thicker layer of the first material over the first region having a first surface material by separately forming each of a first plurality of thinner layers by selective or at least preferential chemical reaction, at block 101. That is, the first thicker layer may be formed stepwise, sequentially, or in stages by forming multiple separate or discrete thinner layers. In some embodiments, the first thicker layer may be formed from at least five thinner layers. For example, in various embodiments, the first thicker layer may be formed from about 5 to about 50 thinner layers, or from about 5 to about 30 thinner layers, or from about 7 to about 20 thinner layers. As used herein, the terms "thinner" and "thicker" are relative terms (i.e., relative to one another) not absolute terms (i.e., each thinner layer is thinner than the thicker layer). In some embodiments, each of the thinner layers may be formed by selective or at least preferential chemical reaction. The selective or at least preferential reaction is selective or at least preferential initially to the first surface material and then to the first material deposited by the reaction, as compared to other exposed materials (e.g., the second surface material and the second material).

Referring again to FIG. 1, the method includes limiting encroachment of each of the thinner layers over a second region that is adjacent to the first region, at block 102. Various different embodiments of approaches for limiting the encroachment disclosed elsewhere herein are suitable.

The method includes forming the second thicker layer of the second material over the second region having a second surface material, at block 103. As used herein, a layer formed "over" another layer encompasses the layer being formed directly "on" the other layer as well as the layer being "over" the other layer but separated from the other layer by one or more intervening layers or materials. In some embodiments, forming the second thicker layer may include forming each of a second plurality of thinner layers by selective or at least preferential chemical reaction. In other embodiments, forming the second thicker layer may include forming a single layer through a single deposition.

The first and second surface materials represent different materials. In some embodiments, the first surface material may be a metal, and the second surface material may be a dielectric material, although the scope of the invention is not so limited. For example, in other embodiments, the first and second surface materials may represent any two of a semiconductor material, a metal, a dielectric material, and an organic material (e.g., a polymeric material), to name just a few examples.

Advantageously, the method includes limiting the encroachment of each of the first plurality of the thinner layers over the second region. When forming vias, interconnect structures, microelectronic structures, or other small structures through layers of materials formed over small regions, it is often desirable to limit encroachment of the layers of materials over the adjacent regions. This tends to be especially true when the regions are very small and/or when the thicknesses of the layers of materials are significant relative to the small sizes of the regions. In some embodiments, the first region and/or the second region may represent a very small region. For example, in some embodiments, the first region and/or the second region may have a lateral cross-sectional dimension or critical dimension of less than about 100 nm, such as, for example, ranging from about 5 nm to about 100 nm, or from about 10 nm to about 50 nm, or from about 10 nm to about 30 nm, although the scope of the invention is not so limited. In some embodiments, the thicknesses of the first and/or second thicker layers may be significant relative to the dimensions of the first region and/or the second region. (e.g., the thicknesses of the first and/or second layers may be at least 5% of the critical dimension of one of the first and second regions), although the scope of the invention is not so limited. In various embodiments, the first thicker layer and/or the second thicker layer may have a thickness ranging from about 5 nm to about 100 nm, or from about 10 nm to about 50 nm, or from about 10 nm to about 30 nm, although the scope of the invention is not so limited.

FIG. 2 is a block flow diagram of an embodiment of a method 200 of forming first and second thicker layers over respective first and second adjacent regions that includes alternating between forming thinner layers of each of the first and second thicker layers. FIGS. 3A to 3E are cross-sectional side views of intermediate substrates at different stages of the method of FIG. 2. For clarity, the method of FIG. 2 will be described in association with the intermediate substrates of FIGS. 3A to 3E. The components, features, and specific optional details described for the intermediate substrates of FIGS. 3A to 3E also optionally apply to the operations and/or method of FIG. 2, which in embodiments may be performed using such intermediate substrates. Alternatively, the operations and/or method of FIG. 2 may be used with different substrates than those of FIGS. 3A to 3E. Moreover, the substrates of FIGS. 3A to 3E may be used with different operations and/or methods than that of FIG. 2.

The method includes forming a thinner layer of a first material over a first region having a first surface material (e.g., a metal) by selective or at least preferential chemical reaction, at block 205. In some embodiments, the thinner layer of the first material may have a thickness that is sufficient to limit encroachment of the thinner layer and/or first material on a second region that is adjacent to the first region. By way of example, in various embodiments, the thinner layer of the first material may have a thickness that is between about 0.5 nm and about 4 nm, or between about 1 nm and about 2 nm. Forming such thin layers represents one embodiment of an approach for limiting encroachment of the thinner layers over the adjacent region.

Figure 3A:
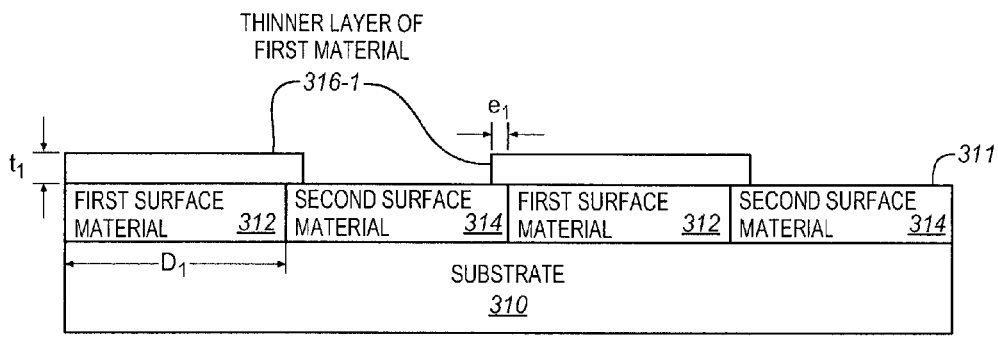
FIGS. 3A to 3E are cross-sectional side views of intermediate substrates at different stages of the method of FIG. 2.

FIG. 3A shows a substrate 310. In some embodiments, the substrate may represent a semiconductor substrate. The semiconductor substrate may represent a workpiece object used to manufacture integrated circuits, microelectronic devices, or the like. The semiconductor substrate often includes a wafer or other piece of silicon or other semiconductor material. Suitable semiconductor substrates include, but are not limited to, single crystal silicon, polycrystalline silicon and silicon on insulator (SOI), as well as substrates formed of other types of semiconductor materials. In addition to semiconductors the substrate may also include metals, dielectrics, dopants, and other materials commonly found in integrated circuits. Alternatively, any other suitable types of substrates known in the arts may be used instead (i.e., not limited to only integrated circuit manufacturing). The semiconductor substrate, depending on the stage of manufacture, often has formed therein transistors, integrated circuitry, and the like, although the scope of the invention is not so limited.

The substrate has an exposed top surface 311. As used herein, the terms top, bottom, under, over, and the like, as used herein to refer to the structures as viewed in the illustrations. It is to be appreciated that the structures may be used in a variety of different orientations. The top surface has first patterned regions having a first surface material 312, and second patterned regions having a second different surface material 314. In some embodiments, each of the first patterned regions and/or the second patterned regions may have lateral cross-sectional dimensions ranging from about 5 nm to about 100 nm, or from about 10 nm to about 30 nm, although the scope of the invention is not so limited.

In some embodiments, the first surface material may be a metal and the second surface material may be a dielectric material, although the scope of the invention is not so limited. By way of example, in embodiments involving forming vias, the metal may represent a top surface of an exposed interconnect line, and the dielectric material may represent an exposed top surface of an inter-layer dielectric (ILD). As used herein, the term metal may encompass pure metals as well as alloys, stacks, and other combinations of two or more different types of metals or metal materials. For example, a metal interconnect line may include a barrier layer, a stack of two or more different metals, an alloy of two or more different types of metals, or some combination thereof. In some embodiments, the metal may include copper (e.g., pure copper or any of various conventional copper alloys suitable for interconnect lines). In other embodiments, the metal may include other conductive metals, with or without copper, which are suitable for interconnect lines (e.g., metals well suited for very small interconnect lines). Commonly, the dielectric material may include silicon and oxygen (e.g., any of various oxides of silicon) potentially/optionally combined with one or more other materials (e.g., carbon, additives, other materials found in ILDs, etc.). Specific examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. Alternatively, other materials may alternatively be used, such as, for example, any combination of metals, dielectrics, semiconductors, and organic materials.

Referring again to FIG. 3A, a first set of thinner layers of a first material (e.g., a metal) 316-1 have been formed selectively over the first regions having the first surface material (e.g., a metal) 312 by selective or at least preferential chemical reaction. The thinner layers of the first material have a thickness (t1) and an encroachment (e1) over the adjacent second region. Generally, the amount of encroachment tends to increase with increasing layer thickness, since the chemical reaction used to form the layers tends to deposit or form material both vertically upward from the top major surface of the thinner layer as well as laterally from the vertical sidewalls of the thinner layer. That is, the growth of the layers may tend to "mushroom" due in part to lateral growth of the material from the vertical sides of the layer. In some embodiments, the thickness (t1) may be sufficient to limit encroachment of the thinner layers of the first material on the adjacent second regions and/or the second surface materials. For example, in various embodiments, the thickness (t1) may be between about 0.5 nm and about 4 nm, or between about 1 nm and about 2 nm. Forming such thin layers represents one embodiment of an approach to help limit encroachment of the thin layers over the adjacent region.

Turning again to FIG. 2, the method includes forming a thinner layer of a second material selectively over the second region having a second surface material by selective or at least preferential chemical reaction, at block 206. In some embodiments, the thinner layer of the second material may have a thickness that is sufficient to limit encroachment of the thinner layer and/or first material on the adjacent first region. By way of example, in various embodiments, the thinner layer of the second material may have a thickness that is between about 0.5 nm and about 4 nm, or between about 1 nm and about 2 nm. Forming such thin layers represents one embodiment of an approach to help limit the lateral encroachment of the layers over the adjacent region.

Figure 3B:
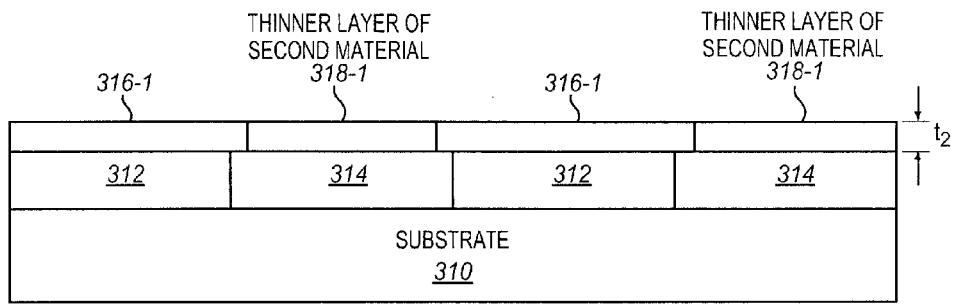

FIG. 3B shows a first set of thinner layers of a second material (e.g., a dielectric material) 318-1 formed over the second region having the second surface material 314 (e.g., a dielectric material) by selective or at least preferential chemical reaction. The thinner layers of the second material have a thickness (t2). In this embodiment, the thickness (t2) is approximately equal to the thickness (t1) of the thinner layers of the first material, although this is not required. As before, in some embodiments, the thickness (t2) may be sufficient to limit encroachment of the thinner layers of the second material on the adjacent second regions and/or the second surface materials. The previously mentioned thicknesses are suitable.

As well viewed in FIG. 3B, the thinner layers of the second material 318-1 do not encroach over the adjacent first region and/or the first surface material 312. Rather, the thinner layers of the second material 318-1 have formed in the spaces between the thinner layers of the first material 316-1 until the thinner layers of the first and second materials abut one another. Once the thinner layer of the second material abuts the thinner layer of the first material no more lateral growth will generally occur unless the height of the thinner layer of the second material surpasses that of the thinner layer of the first material. Advantageously, the thinner layers of the first material 316-1 may help to corral, constrain, or otherwise limit the encroachment of the thinner layers of the second material 318-1 over the adjacent first region and/or the first surface material 312. Alternating between forming the thinner layers of the first and second materials over the respective first and second adjacent regions represents one embodiment of an approach to help limit encroachment of the layers over the adjacent regions.

Another embodiment of an approach to help limit encroachment of the layers over the adjacent regions is to start by depositing the layer having the least amount of lateral encroachment. In some embodiments, the initial thinner layers formed at a given level (e.g., in the illustrated embodiment the thinner layers of the first material 316-1) may be selected to be the one that provides the least amount of lateral encroachment per layer thickness. In this way, a thin layer may be formed with a relatively lowest amount of encroachment and may then be used to corral, constrain, or otherwise limit the encroachment of the other material having a higher amount of lateral encroachment per layer thickness. This represents another embodiment of an approach to help reduce the amount of encroachment of a thin layer over an adjacent region.

Referring again to FIG. 2, if the cumulative layers of the first and/or second materials are not thick enough, the method may revisit blocks 205 and 206 one or more times. In some embodiments, the method may loop back through blocks 205 and 206 until at least five thinner layers have been formed of each of the first and second materials. For example, in some embodiments, there may be between about 5 to about 50, or from about 5 to about 30, or from about 7 to about 20 thinner layers of each of the first and second materials. Each of the layers may be formed substantially as described above. At some point, when the cumulative thicker layers of the first and second materials are thick enough, the method may end, at block 208. It is to be appreciated that in an actual implementation there may be no such determination at each iteration of the loop, but rather the method of depositing alternately the thinner layers of the first and second materials may simply be repeated a given or predetermined number of times.

Figure 3C:
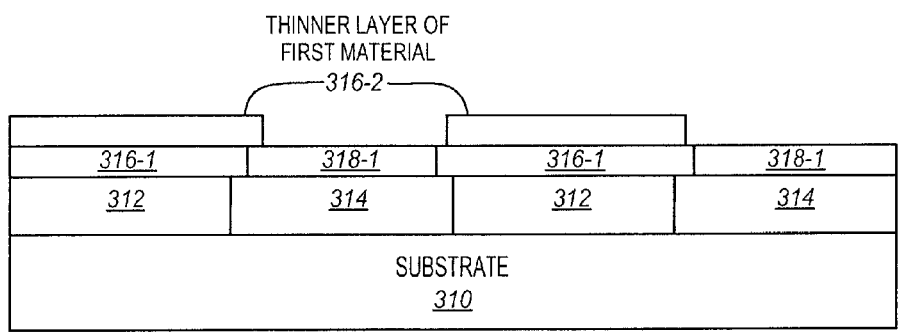
Figure 3D:
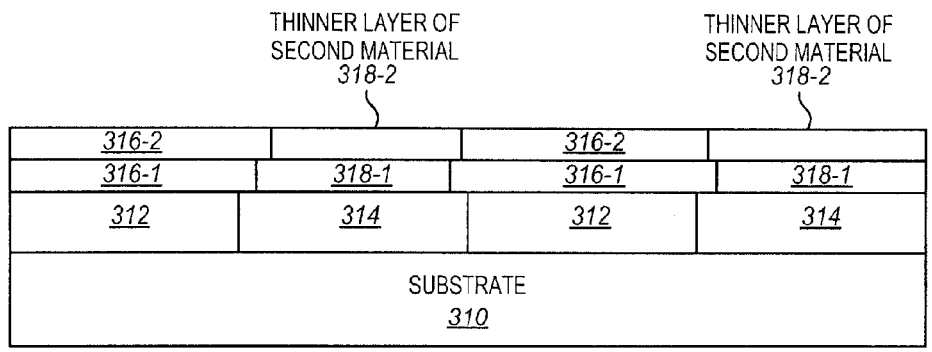
Figure 3E:
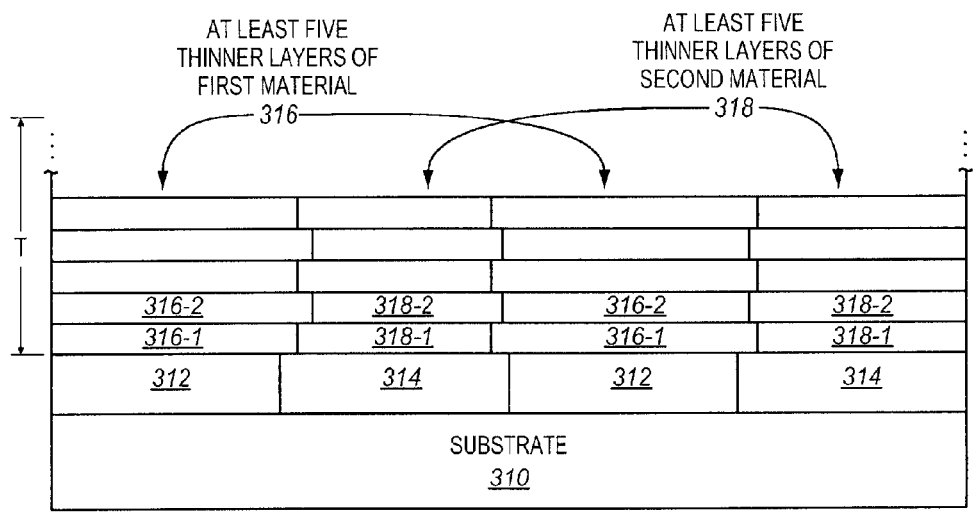

FIG. 3C shows an additional second set of thinner layers of a first material (e.g., a metal) 316-2 selectively formed over the initially deposited thinner layers of the first material 312 by selective or at least preferential chemical reaction. FIG. 3D shows an additional second set of thinner layers of a second material (e.g., a dielectric material) 318-2 selectively formed over the initially deposited thinner layers of the second material 314 by selective or at least preferential chemical reaction. FIG. 3E shows at least five thinner layers of the first material selectively formed over the first patterned region and at least five thinner layers of the second material selectively formed over the second patterned region. In other embodiments, there may be fewer or more layers. Each of these layers may be formed substantially as described elsewhere herein. These layers are formed sequentially, stage wise, stepwise, or in cycles and by alternating between forming layers of different types of materials to allow gradual formation of both of the thicker layers through a gradual buildup process.

Figure 4A:
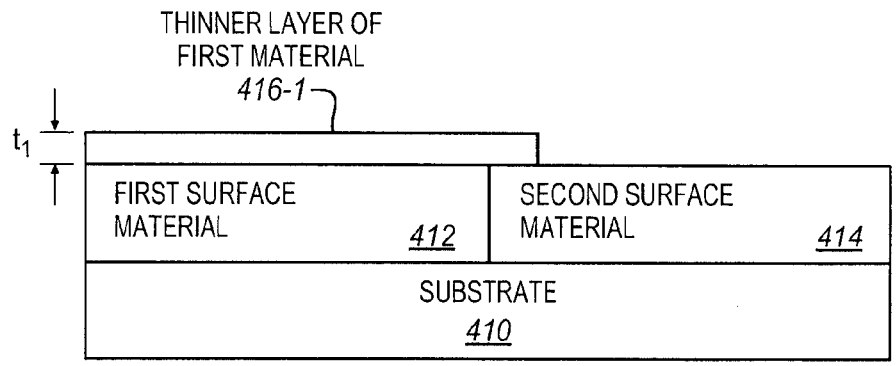
FIGS. 4A to 4C are cross-sectional side views of intermediate substrates at different stages of a method of forming first and second thicker layers over respective first and second adjacent regions that includes alternating between forming thinner layers of each of the first and second thicker layers, and in which thinner layers of the different materials are grown above one another.
Figure 4B:
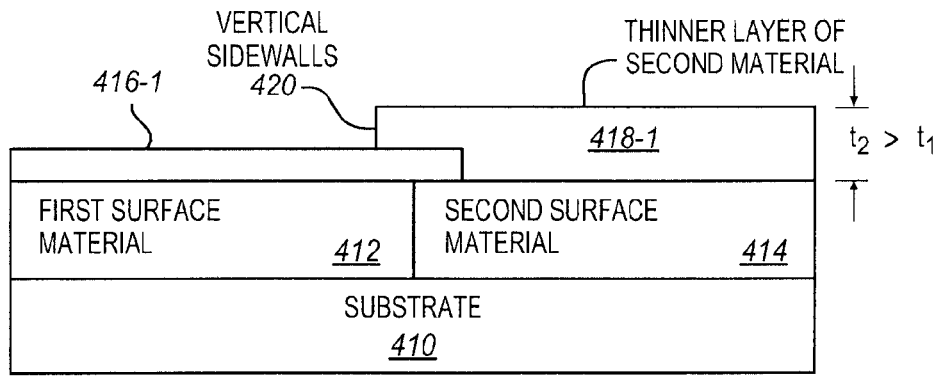
Figure 4C:
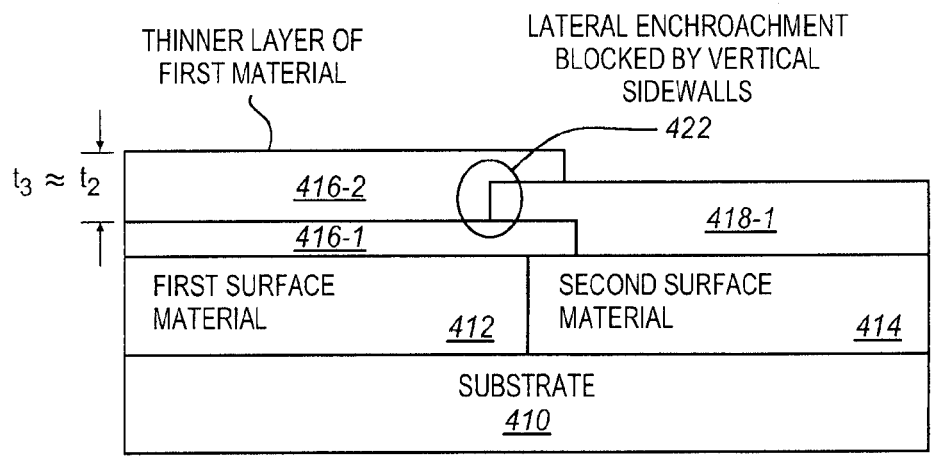

FIGS. 4A to 4C are cross-sectional side views of intermediate substrates at different stages of a method of forming first and second thicker layers over respective first and second adjacent regions that includes alternating between forming thinner layers of each of the first and second thicker layers, and in which thinner layers of the different materials are grown above one another. In some embodiments, the intermediate substrates may be used in the method of FIG. 2, and the components, features, and specific optional details described for the intermediate substrates also optionally apply to the operations and/or method of FIG. 2. Alternatively, the operations and/or method of FIG. 2 may be used with different substrates. Moreover, the intermediate substrates of FIGS. 4A to 4C may be used with different operations and/or methods.

FIG. 4A shows a substrate 410, a first surface material 412 (e.g., a metal) over a first region of the substrate, and a second surface material 414 (e.g., a dielectric material) over a second region of the substrate. The substrate, the first material, and the second material may each be similar to or the same as those described above. A first thinner layer of a first material 416-1 is formed over the first surface material 412 and/or the first region through a selective or at least preferential chemical reaction. The layer 412 may be formed substantially as previously described. The layer 412 has a thickness (t1). The previously described thicknesses are suitable (e.g., between about 0.5 nm and about 4 nm, or between about 1 nm and about 2 nm).

FIG. 4B shows a first thinner layer of a second material 418-1 formed over the second surface material 414 and/or the second region through a selective or at least preferential chemical reaction. The layer 418-1 has a thickness (t2), which is greater than the thickness (t1) of the layer 416-1. The layer 418-1 terminates at a height above the layer 416-1. The additional height of the layer 418-1 effectively creates or forms vertical sidewalls 420 of the second material that may subsequently help to corral, restrain, or otherwise limit encroachment of a subsequently formed second thinner layer of the first material.

FIG. 4C shows a second thinner layer of the first material 416-2 formed over the first surface material 412 and/or the first region through a selective or at least preferential chemical reaction. As shown at reference 422, lateral encroachment of the layer 416-2 is initially blocked by the vertical sidewalls 420. That is, the vertical sidewalls 420 and/or the additional height of the layer 418-1 over the layer 416-1 may help to corral, restrain, or otherwise limit encroachment of the layer 416-2. Only after the thickness of the layer 416-2 surpasses the height of the vertical sidewalls 420 does lateral encroachment begin to occur toward and then over the second region. Moreover, such lateral encroachment may be tolerable, since it also may help to form its own vertical sidewalls, which may help to corral, restrain, or otherwise limit the lateral encroachment of a subsequently layer of the second material.

Many different types of selective or at least preferential reactive depositions known in the arts are suitable for the various embodiments disclosed herein. In some embodiments, selective metal-on-metal reactive depositions may be accomplished in solution using techniques such as electroless metal deposition and/or electrochemical atomic layer deposition. Examples of suitable metals for such metal-on-metal reactive depositions include, but are not limited to, copper (Cu), nickel (Ni), cobalt (Co), iron (Fe), manganese (Mn), chromium (Cr), titanium (Ti), tantalum (Ta), ruthenium (Ru), palladium (Pd), and various alloys, stacks, or other combinations thereof. Other metals that may be deposited by selective reaction using electroless metal depositions and/or electrochemical atomic layer depositions should also be generally suitable.

In some embodiments, the selective metal-on-metal reactive deposition may be performed with homoleptic metal diazabutadiene complexes [M{N(R)C(H)C(H)N(R')}2]. In this formula, M may represent a metal atom selected from nickel (Ni), cobalt (Co), iron (Fe), manganese (Mn), or chromium (Cr). The organic functional groups R and R' may represent any of various substituted or un-substituted alkyl or aryl functional groups. Examples of R and R' include, but are not limited to, substituted or un-substituted two to eight carbon alkyl groups, phenyl groups, and the like. Combinations of different complexes (e.g., having different metal atoms) may also optionally be used. A metal (e.g., a pure metal or an alloy or stack of multiple metals) may be deposited on a starting metal and/or on the metals deposited from these complexes by using chemical vapor deposition (CVD) either with or without a co-reactant (e.g., hydrogen ($H_2$), ammonia ($NH_3$), hydrazine, etc.). Atomic layer deposition (ALD) may alternatively be used. Such depositions will be generally selective compared to dielectric materials, semiconductor materials, and organic polymeric materials.

In some embodiments, an applied voltage and/or the photoelectric effect may be used to promote metal deposition and/or increase the selectivity of a metal deposition over a metal as compared to another material (e.g., a dielectric). In some embodiments, a voltage bias may be applied between a wafer or other substrate and conductive hardware in metal deposition equipment, for example, between a wafer chuck and a coil above a wafer on the wafer chuck. This voltage bias may be either direct current (DC) or alternating current (AC) for example radiofrequency AC. The applied voltage bias may tend to generate, reduce the energy needed to release, or otherwise provide electrons (e.g., secondary electrons) relatively more from a metal (e.g., an interconnect line or metal material formed over the interconnect line) than from another material (e.g., dielectric), for example, due in part to the photoelectric effect. In some embodiments, a forward voltage bias may be applied in order to help accelerate electrons in the direction away from the metal. When a DC voltage bias is used there is a possibility that the release of electrons may slow down after some electrons are emitted from the metal and it begins to have a net positive charge, unless there is a conductive path to the metal. However, application of an AC voltage bias may generally help to avoid this by loading the metal back up with electrons in between cycles. The electrons may be used to promote metal deposition and/or increase the selectivity of a metal deposition over the metal as compared to another material (e.g., dielectric). The electrons may help to provide energy to drive or promote a selective metal deposition reaction, such as, for example, an ALD or CVD deposition of a metal or other metal deposition process that can be promoted by such generated electrons. In some embodiments, an ultraviolet light source may be used with the voltage bias to help further generate photoelectrons near the metal. This may further help to promote the metal deposition and metal deposition selectivity.

In some embodiments, selective dielectric-on-dielectric reactive depositions may be accomplished by solution phase techniques such as sol-gel processes. Selective dielectric-on-dielectric reactive depositions may also be accomplished by CVD, ALD, MLD, or other vapor phase techniques. Examples of suitable materials for such dielectric-on-dielectric reactive depositions include, but are not limited to, oxides of silicon (e.g., silicon dioxide ($SiO_2$)), carbon doped oxides of silicon, nitrides of silicon (e.g., silicon nitride (SiN)), carbides of silicon (e.g., silicon carbide (SiC)), carbo-nitrides of silicon (e.g., SiCN), oxides of aluminum (e.g., aluminum oxide ($Al_2O_3$)), oxides of titanium (e.g., titanium oxide ($TiO_2$)), oxides of zirconium (e.g., zirconium oxide ($ZrO_2$)), oxides of hafnium (e.g., hafnium oxide ($HfO_2$)), and combinations thereof, to name just a few illustrative examples. Other dielectric and low-k dielectric materials known in the arts are also potentially suitable. Carbosiloxane materials may also optionally be used. Various examples of reactions to deposit such materials selectively or at least preferentially as compared to metals using techniques such as sol-gel, ALD, CVD, and MLD, are known in the arts.

In some embodiments, one or more of carbon nanotubes, graphene, and graphite may be grown or formed over a metal surface material. The metal surface material may represent a catalytic metal surface material that is catalytic to growth of the carbon nanotubes, grapheme, or graphite. The catalytic metal surface material may be heated and exposed to suitable hydrocarbons and any other co-reactants using techniques known in the arts. One example of a suitable catalytic surface and set of reactants is a cobalt surface exposed to carbon monoxide and hydrogen. The voltage bias approach described above may also potentially be used to help promote such reactions.

In some embodiments, a passivant material or layer may optionally be applied or formed over one of the different surface materials in order to help increase the selectivity or preferentiality of the reaction to another of the surface materials. The use of such a passivant material generally helps to expand the number of possible selective/preferential reactions available to form the layers. Reactions not necessarily selective/preferential to one of the surface materials over the other, may nevertheless be selective to one of the surface materials as compared to the passivant material. By way of example, a passivant material may be applied to a first surface material but not on a second surface material in order to increase selectivity/preferentiality of a given deposition reaction to the second surface material as compared to the passivant material. Most passivant materials operable to be formed selectively over one of the materials and operable to increase the selectivity/preferentiality of the reaction should generally be suitable. Such passivants may be applied in vapor phase or solution phase. Such passivants may be applied once or multiple times during the selective deposition process. After the layer has been formed through the selective/preferential reaction, the passivant material may be removed. For example, the passivant material may be removed through a thermal, photolytic, chemical, or electrochemical treatment. In some embodiments, another passivant material may optionally be applied to other surface material, although this is not required. Again, the use of such passivant materials, which is optional, may help to expand the number of possible selective or at least preferential chemical reactions that may be used to form the various layers mentioned herein.

In some cases one of the materials may be a dielectric material and the other material may be a metal material, or an organic polymeric material or other material that doesn't react with aminosilanes, halosilanes, alkoxysilanes, or other functionalized silanes. Aminosilanes, halosilanes (e.g., chlorosilanes, fluorosilanes, etc.), and alkoxysilanes (e.g., methoxysilanes, ethoxysilanes, and other alkoxysilanes) are able to react selectively or at least preferentially with hydroxylated groups on the surface of the dielectric material as compared to the metal material. Specific examples of suitable silanes include, but are not limited to, trichlorooctadecylsilane, octadecylchlorosilane, diethylaminotrimethyl silanes, bis(dimethylamino)dimethylsilane, methoxysilanes, ethoxysilanes, and other similar silanes, and combinations thereof. Reaction products of these reactions may be used to selectively cover the exposed surface of the dielectric material. If a certain generally lesser amount of reaction does occur on the metal material it may be removed, for example, by a wash with water. The silanes may include one or more other groups, such as, for example, straight alkane chains, branched alkane chains, other straight or branched organic chains, benzylic groups, or other organic groups, or various other known functional groups, in order to alter the chemical properties of the silanes and achieve the desired chemical properties. As another example, bi-functional, tri-functional, multi-functional electrophiles, or a combination thereof, may be reacted with hydroxylated groups of a material (e.g., an ILD) followed by reaction with functional group of a polymer with the resulting activated reaction product.

In some cases one of the materials may be a metal material, and the other material may be a dielectric material, an organic polymeric material, or another material that doesn't react with phosphonic acids. Various phosphonic acids are able to react selectively or at least preferentially with metal surfaces, either native or oxidized, to form strongly bound metal phosphonates preferentially or even selectively over surfaces of dielectric materials (e.g., oxides of silicon). A specific example of a suitable phosphonic acid is octadecylphosphonic acid (ODPA). Such surface coatings generally tend to be stable in many organic solvents but may be removed using mild aqueous acid and base solutions. Phosphines (e.g., organophosphines) may also optionally be used. Other common acids such as sulfonic acids, sulfinic acids and carboxylic acids may also be optionally used.

Another example of a reaction that is selective or at least preferential to metal materials as compared to dielectric materials or organic polymeric materials or other materials, are various metal corrosion inhibitors, such as, for example those used during chemical mechanical polishing to protect interconnect structures. Specific examples include benzotriazole, other triazole functional groups, other suitable heterocyclic groups (e.g., heterocyclic based corrosion inhibitors), and other metal corrosion inhibitors known in the arts. In addition to triazole groups, other functional groups may be used to provide the desired attraction or reactivity toward the metals. Various metal chelating agents are also potentially suitable. Various amines (e.g., organoamines) are also potentially suitable.

Yet another example of a reaction that is selective or at least preferential to metal materials as compared to dielectric materials or organic polymeric materials or other materials, are various thiols. As another example, 1,2,4-triazole or similar aromatic heterocycle compounds may be used to react selectively with the metal as compared to dielectric and certain other materials. Various other metal poisoning compounds known in the arts may also potentially be used It is to be appreciated that these are just a few illustrative examples, and that still other examples will be apparent to those skilled in the arts and having the benefit of the present disclosure.

In another embodiment, one or more etchant species may optionally be introduced during the selective deposition process in order to remove atoms or material from surfaces where growth is not wanted. The etchant species may remove unintentionally deposited materials which are not wanted. Such etchant species may be applied in the liquid or vapor phase and may include, but are not limited to, hydrogen, halogens, haloacids and neutral forms of organometallic ligands suitable for metal atoms to be removed. Such an approach may also be used in combination with other embodiments disclosed herein to help increase the selectivity of a deposition.

In some embodiments, a sacrificial material (e.g., a sacrificial organic polymeric material) may be used as one of the first and second materials. Advantageously, this may help to expand the available number of different selective or at least preferential reactions that may be used to form the first and second thicker layers.

FIGS. 5A to 5E are cross-sectional side views of intermediate substrates at different stages of a method of forming first and second thicker layers over respective first and second adjacent regions that includes alternating between forming thinner layers of each of the first and second thicker layers, and in which one of the layers includes a sacrificial organic polymeric material. In some embodiments, the intermediate substrates may be used in the method of FIG. 2, and the components, features, and specific optional details described for the intermediate substrates also optionally apply to the operations and/or method of FIG. 2. Alternatively, the operations and/or method of FIG. 2 may be used with different substrates. Moreover, the intermediate substrates of FIGS. 5A to 5E may be used with different operations and/or methods than those of FIG. 2.

Figure 5A:
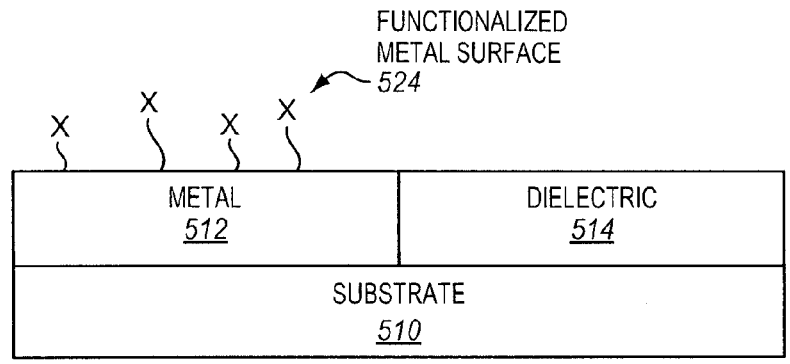
FIGS. 5A to 5E are cross-sectional side views of intermediate substrates at different stages of a method of forming first and second thicker layers over respective first and second adjacent regions that includes alternating between forming thinner layers of each of the first and second thicker layers, and in which one of the layers includes a sacrificial organic material.

FIG. 5A shows a substrate 510, a metal 512 representing a first surface material, and dielectric material 514 representing a second surface material. The substrate, the metal, and the dielectric material may each be similar to or the same as those described elsewhere herein. In this embodiment, the sacrificial organic polymeric material is to be formed over the metal, although the scope of the invention is not so limited. The metal has a functionalized metal surface 524. For example, in some embodiments, the metal surface may be functionalized with a thiol, a phosphonic acid, or other functional group having a latent initiation site (X) to initiate a polymerization reaction. In some embodiments, a passivant material (not shown) may optionally be applied to the dielectric material, such as, for example, by applying an aminosilane or other appropriate silane, although this is not required.

Figure 5B:
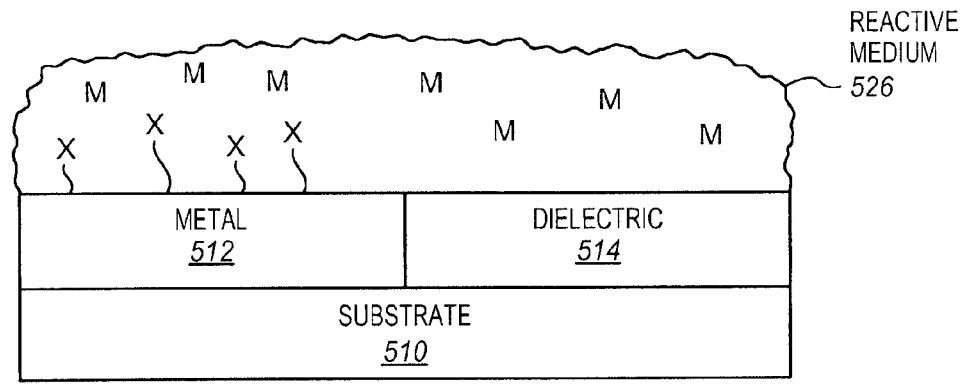

FIG. 5B shows contacting the functionalized metal surface 524 with a reactive medium 526. In various embodiments, the reactive medium may represent a vapor phase, a condensed phase, or a solution. The reactive medium includes one or more different types of monomer (M) suitable for a given polymerization reaction that is to be used to form the organic polymeric material.

Figure 5C:
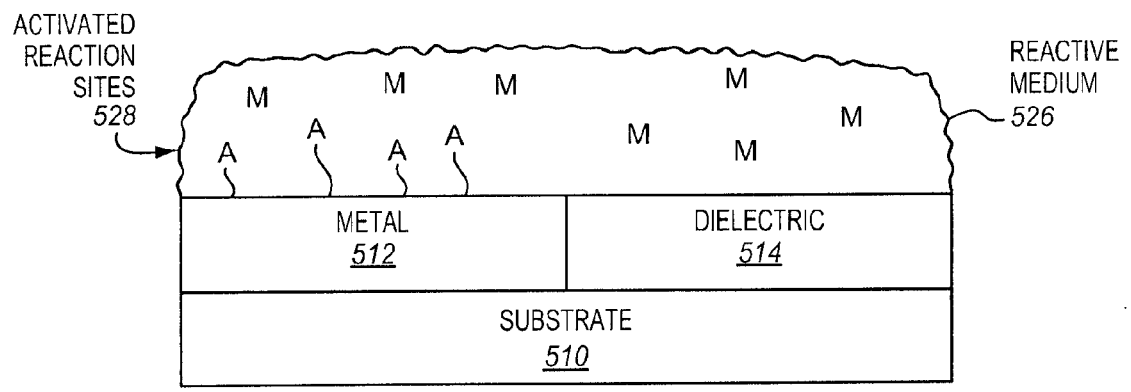

FIG. 5C shows initiating or activating the latent initiation sites (X) to form activated reactive sites (A) 528 over the surface of the metal. In various embodiments, activating or initiating the reactive sites may be performed by heating, applying light, performing a chemical reaction, or by other approaches suitable for the particular sites. The activated reaction sites (A) are operable to react with the monomer (M). As one example, a radical may be generated from a latent radical site and then the generated radical site may be capable of reacting with the monomer. In other embodiments, active ruthenium or other catalytic metal centers may be created thermally, photochemically, or through introduction of catalytic promoters and may be used to react with appropriate monomers (e.g., norbornene type monomers).

The reaction may proceed to effectively bond or attach monomers to growing polymeric chains or molecules that are bonded or attached to the surface of the metal. The polymerization reaction is selective or at least preferential to the metal and to itself (i.e., the growing organic polymers) as compared to the dielectric material.

Figure 5D:
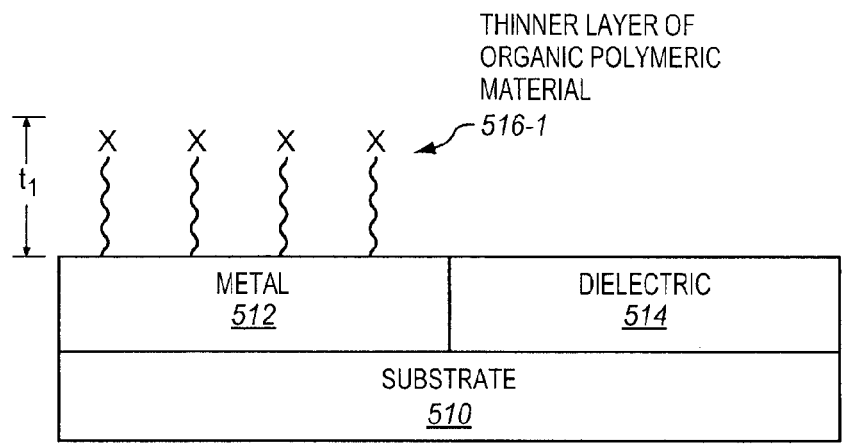

FIG. 5D shows a first thinner layer of an organic polymeric material 516-1 formed over the surface of the metal. The organic polymeric material may include chains or molecules of organic polymer grown by bonding monomer molecules until a desired layer thickness is achieved. The organic polymeric material is formed to have a thickness (t1). In some embodiments, a thin layer of the organic polymeric material may be formed over the metal (e.g., between about 0.5 nm and about 4 nm, or between about 1 nm and about 2 nm). The reaction has been terminated and the reactive medium has been removed. The reaction may be terminated, such as, for example, by adding a reaction suppressor, turning off ultraviolet or other actinic light used to induce the reaction, decreasing the temperature, or the like. As shown, the latent initiation sites (X) may be regenerated. Notice that the organic polymeric material is formed selectively over the metal but not over the dielectric material.

Various examples of suitable organic polymeric materials are contemplated. In some embodiments, the organic polymeric material may be formed as a poly-norbornene or other polymer using ring-opening metathesis polymerization catalyzed by ruthenium or other suitable metal catalysts. In other embodiments, the organic polymeric material may be formed as a polystyrene, polyacrylate, or other polymer using radical and anionic polymerization methods known in the arts. In still other embodiments, the organic polymeric material may be formed as any of various condensation polymers formed via alternating reaction of two bifunctional monomers. Examples of such polymers include, but are not limited to, nylon, polyureas, carbamates, polyimides, and others known in the arts. In further embodiments, the organic polymeric material may be formed as a polythiophene, polyarene, polyacetylide, or other conducting polymer by a palladium, copper, nickel, or other metal catalyzed process. In still further embodiments, the organic polymeric material may be formed as a polyethylene or other organic polymer by a Ziegler-Natta or other polymerization method.

Figure 5E:
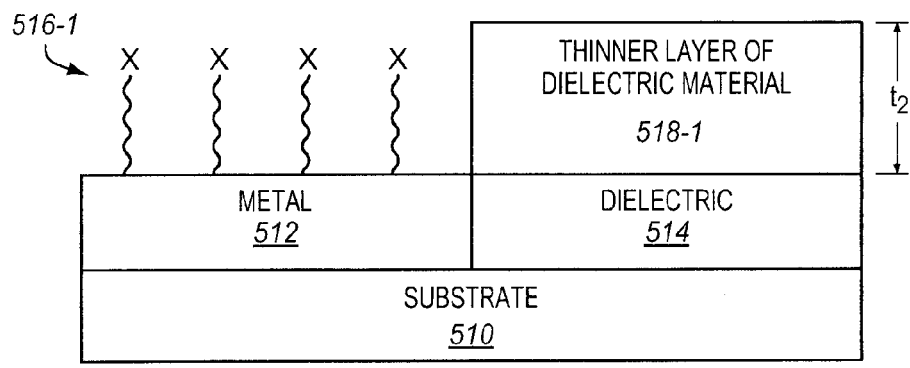

FIG. 5E shows a first thinner layer of a dielectric material 518-1 formed adjacent to the first thinner layer of the organic polymeric material 516-1 over the dielectric material 514. In some embodiments, the layer of the dielectric material may be formed by a reaction that is selective or at least preferential to the dielectric material as compared to the organic polymeric material. The previously described approaches for forming the dielectric material, or others known in the arts, may be used. Alternatively, rather than a dielectric material, a carbosiloxane material may optionally be used. As discussed above, alternating between forming the thinner layers of the different materials may help to limit lateral encroachment. The layer of the dielectric material has a thickness (t2). In the illustrated embodiment, the thickness (t2) is about equal to the thickness (t1) of the layer of the organic polymeric material. Alternatively, an approach similar to that shown in FIGS. 4A-4C may optionally be used instead.

Perfect selectivity in either or both reactions is not required. For example, small amounts of organic polymer growth over the dielectric material may be tolerated if enough other sites remain for depositing the dielectric material. Moreover, the organic polymeric material may optionally be removed from the dielectric material eventually (e.g., by a thermal degradation process). Likewise, small amounts of carbosiloxane or dielectric material deposition within the organic polymeric material over the metal may be tolerated if it does not prevent further organic polymer growth and does not prevent subsequent removal of the sacrificial organic polymeric material.

FIGS. 5A-5E show formation of a thinner layer of an organic polymeric material 516-1 and a thinner layer of dielectric material 518-1, respectively, over underlying metal 512 and dielectric materials 514. In some embodiments, the approach of FIGS. 5A-5E may be generally repeated multiple times to form thicker layers comprised of multiple sequentially and alternately thinner layers as described elsewhere herein (e.g., often five or more thin layers of each material). In some embodiments, thicker layers on the order of tens of nanometers may be formed (e.g., from about 5 to about 100 nm, from about 5 to about 50 nm, from about 10 to about 20 nm, etc.).

In the illustrated example embodiment, the thinner layer of the organic polymeric material 516-1 has been formed prior to the formation of the thinner layer of the dielectric material 518-1, although this is not required. In another embodiment, the thin layer of the dielectric material may be formed first. In some embodiments, whichever one of the organic polymeric material and the dielectric material has a least amount of lateral encroachment over the adjacent region may be formed first. This represents one embodiment of an approach for limiting the lateral encroachment. In still other embodiments, the thinner layers of the different materials may be grown concurrently or simultaneously by performing two selective reactions that are orthogonal to one another (e.g., radical versus condensation reaction) from a single reactive medium.

In the illustrated embodiment, the sacrificial organic polymeric material has been formed over the metal, although this is not required. In another embodiment, the sacrificial organic polymeric material may be formed over the dielectric material. In still other embodiments, the layers may be formed over other types of surface materials besides the metal and the dielectric material (e.g., a semiconductor material, an organic polymeric material, etc.).

Figure 6A:
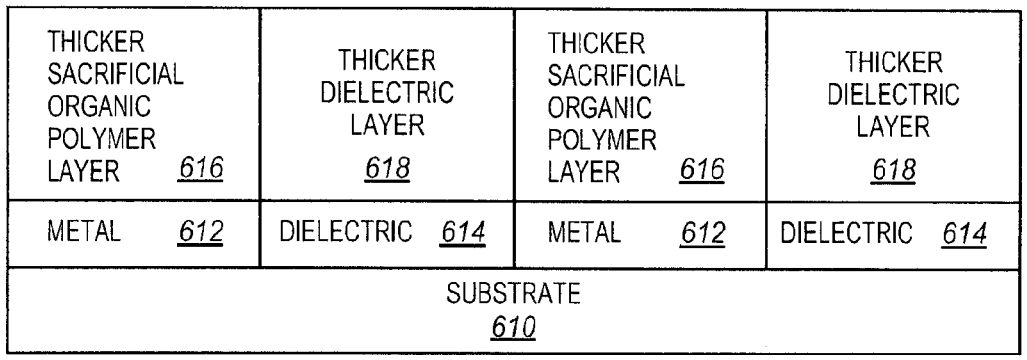
FIGS. 6A to 6C are cross-sectional side views of intermediate substrates at different stages of a method of removing a sacrificial organic material and introducing another material from where the sacrificial organic material was removed.
Figure 6B:
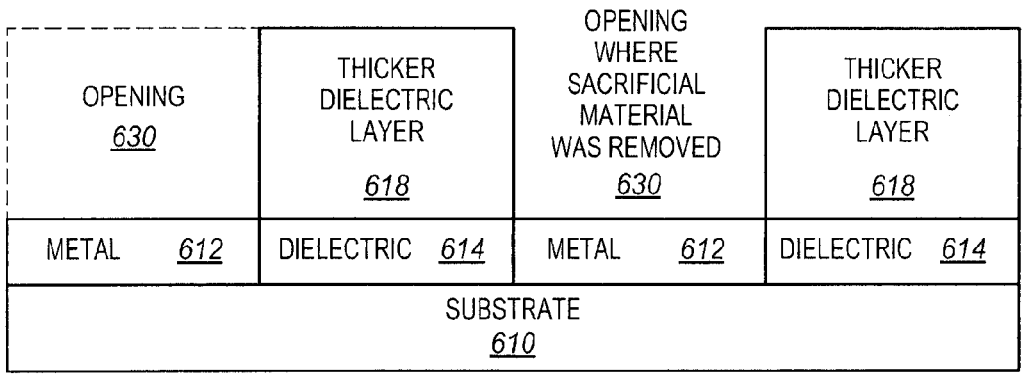
Figure 6C:
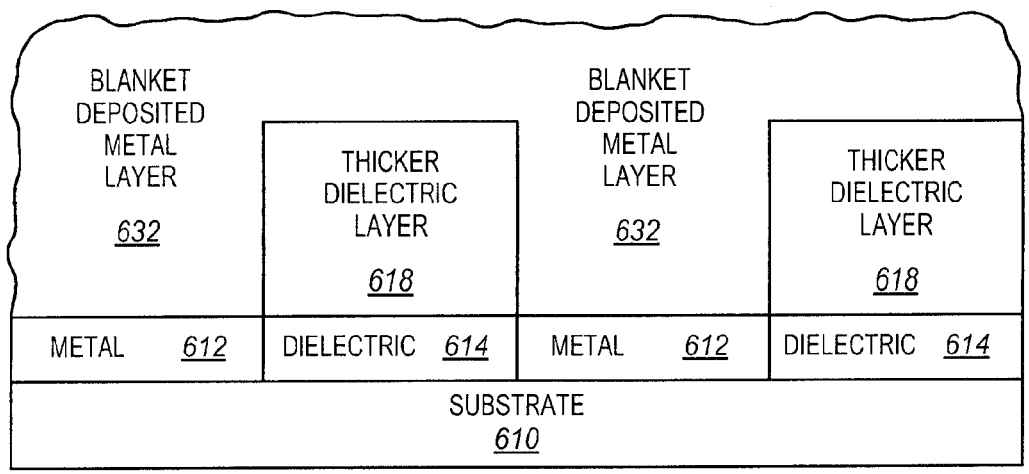

FIGS. 6A to 6C are cross-sectional side views of intermediate substrates at different stages of a method of removing a sacrificial organic polymeric material and introducing another material from where the sacrificial organic polymeric material was removed.

FIG. 6A shows a substrate 610, metal 612 representing a first surface material, and dielectric material 614 representing a second surface material. The substrate, the metal, and the dielectric material may each be similar to or the same as those described elsewhere herein. Thicker sacrificial organic polymer layers 616 have been formed over the metal 612. Thicker dielectric layers 618 have been formed over the dielectric material 614. In some embodiments, the thicker sacrificial organic polymer layers and the thicker dielectric layers may be formed by the approach shown in FIGS. 5A-5E, although this is not required. The components, features, and specific optional details described for FIGS. 5A-5E also optionally apply to FIGS. 6A-6C.

FIG. 6B shows removing the thicker sacrificial organic polymer layers 616 of FIG. 6A to form corresponding openings 630. The openings are defined by the top surfaces of the metal 612, the vertical sidewalls of the thicker dielectric layer 618. The thicker sacrificial organic polymer layers and the thicker dielectric layers may have a different characteristic, such as, for example, an etch rate, a thermal degradation characteristic, or the like, which allows the thicker sacrificial organic polymer layers to be selectively removed. In some embodiments, an etch may be used to etch the thicker sacrificial organic polymer layers. Any etch capable of etching the organic polymeric material selectively or at least preferentially over the dielectric material may potentially be used. In other embodiments, a thermal treatment may be used to thermally degrade and remove the thicker sacrificial organic polymer layers.

FIG. 6C shows blanket depositing a layer of metal 532 into and over the openings 630 and over the thicker dielectric layers 618. The metal is introduced into the openings 630 from where the sacrificial organic polymer layer was removed. In one aspect, this may represent a back fill with the metal. Alternatively, other ways of introducing the metal material known in the arts may be used. In some cases, the top surface of the substrate may be subsequently planarized, for example by chemical mechanical polishing (CMP), etching (e.g., dry etching or wet etching), other top-down material removal methods, or the like, to expose the top surfaces of the thicker dielectric layers.

In the illustrated embodiment, the sacrificial organic polymeric material was over the metal, although this is not required. In another embodiment, the sacrificial organic polymeric material may be over the dielectric material. In still other embodiments, other materials besides metal and dielectric materials may be used (e.g., a semiconductor material, an organic polymeric material, etc.).

FIG. 7 is a block flow diagram of an embodiment of a method 700 of forming first and second thicker layers of first and second materials over respective first and second adjacent regions that includes alternating between forming thinner layers of the first material and reducing lateral encroachment of the thinner layers of the first material over the adjacent second region. FIGS. 8A to 8E are cross-sectional side views of intermediate substrates at different stages of the method of FIG. 7. For clarity, the method of FIG. 7 will be described in association with the intermediate substrates of FIGS. 8A to 8E. The components, features, and specific optional details described for the intermediate substrates of FIGS. 8A to 8E also optionally apply to the operations and/or method of FIG. 7, which in embodiments may be performed using such intermediate substrates. Alternatively, the operations and/or method of FIG. 7 may be used with different substrates than those of FIGS. 8A to 8E. Moreover, the substrates of FIGS. 8A to 8E may be used with different operations and/or methods than that of FIG. 7.

The method includes forming a thinner layer of a first material over a first region having a first surface material by selective or at least preferential chemical reaction, at block 740. In some embodiments, the first surface material may be a metal. In other embodiments, the first surface material may be a dielectric material. Alternatively, other materials besides metals and dielectric materials may be used. The various approaches for forming these thinner layers by selective or at least preferential reaction described elsewhere herein are suitable. In some embodiments, the thinner layer of the first material may have a thickness that is sufficient to limit encroachment of the thinner layer and/or first material on a second region that is adjacent to the first region. By way of example, in various embodiments, the thinner layer of the first material may have a thickness that is between about 1 nm and about 6 nm, or between about 1 nm and about 4 nm, or between about 1 nm and about 2 nm. Forming such thin layers represents one embodiment of an approach for limiting encroachment of the thinner layers over the adjacent region.

Figure 8A:
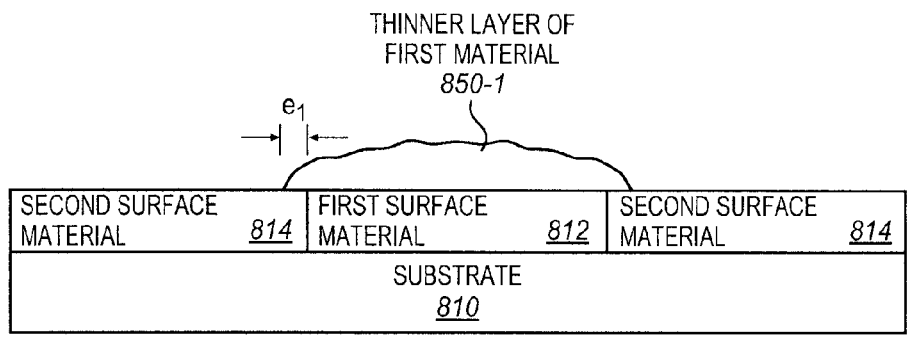
FIGS. 8A to 8E are cross-sectional side views of intermediate substrates at different stages of the method of FIG. 7.

FIG. 8A shows a substrate 810, a first surface material 812 (e.g., a metal or a dielectric material) over a first region of the substrate, and a different second surface material 814 (e.g., a metal or a dielectric material) over adjacent second regions of the substrate. The substrate, the first surface material, and the second surface material may each be similar to or the same as those described above. A first thinner layer of a first material 850-1 is formed over the first surface material 812 and/or the first region through a selective or at least preferential chemical reaction. The layer 850-1 may be formed substantially as previously described. The layer 850-1 has a thickness (a). In various embodiments, the thickness may be between about 1 nm and about 6 nm, or between about 1 nm and about 4 nm, or between about 1 nm and about 2 nm. Forming such thin layers represents one embodiment of an approach for limiting encroachment of the thinner layers over the adjacent region. The layer 850-1 has an encroachment (e1) over the second surface material and/or the second regions.

Referring again to FIG. 7, the method includes reducing encroachment of the thinner layer of the first material over the second surface material and/or the adjacent second regions, at block 741. In some embodiments, the encroachment may be reduced by performing a trim etch. For example, a directional etch, a reactive ion etch, a plasma dry etch may be used to reduce the encroachment by etching, trimming, or clipping excess material in a lateral direction. Such an etch may achieve sidewalls that are orthogonal, or at least more orthogonal, to the underlying surface. The lateral encroachment may be etched away earlier than the top surface due to the typical thickness difference between the encroachment at the edges and the central regions of the layers. The time of the etch may be controlled to remove a desired amount of the encroachment. By way of example, a chlorine or hydrogen bromide etch may be used for aluminum or hafnium metal, a carbon monoxide or ammonium fluoride etch may be used for cobalt metal, a hydrofluoric acid or carbon tetrafluoride etch may be used for oxide based dielectric materials.

In other embodiments, the encroachment may be reduced by performing an anneal. The anneal may increase the temperature of the thinner layer of the first material. In various aspects, the temperature may be increased by baking, heating in an oven, heating with a thermal lamp, applying infrared radiation, heating with a laser, or otherwise applying heat and/or increasing the temperature. In some embodiments, the temperature may be increased until the first material melts, recrystallizes, reforms, achieves vertical growth, or otherwise reduces the encroachment. One specific example of a suitable anneal is a rapid thermal anneal sufficient to recrystallize a metal and drive growth along a crystallographic axis, which may help to reduce encroachment. In other embodiments, other thermal treatments, crystallization treatments, or other encroachment reducing treatments may be used.

Figure 8B:
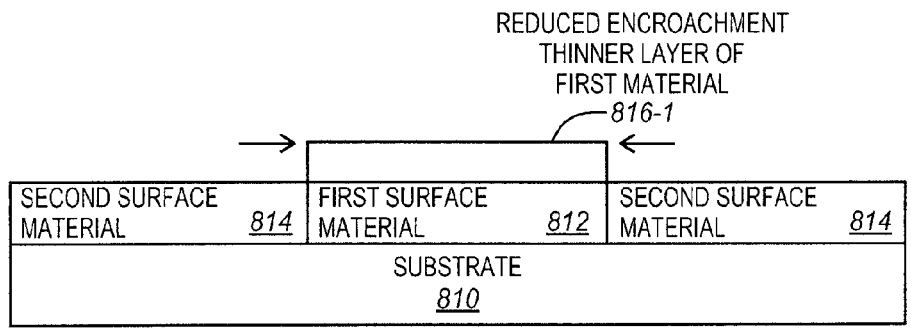

FIG. 8B shows a first modified reduced encroachment thinner layer of the first material 816-1. The amount of encroachment may either be reduced a little or a lot, as desired depending upon the particular implementation. In some embodiments, the encroachment may be reduced until the amount of encroachment is approximately zero. Alternatively, a lesser amount of encroachment may be allowed to remain.

Referring again to FIG. 7, at block 742, if the cumulative thicker layer of the first material is not thick enough, the method may revisit blocks 740 and 741 one or more times. In some embodiments, the method may loop back through blocks 740 and 741 until at least five thinner layers of the first material have been formed. For example, in some embodiments, there may be between about 5 to about 50, or from about 5 to about 30, or from about 7 to about 20 thinner layers of the first material. Each of the layers may be formed substantially as described above. At some point, when the cumulative thicker layer of the first material is thick enough, the method may advance to block 743. It is to be appreciated that in an actual implementation there may be no actual determination at each iteration of the loop, but rather the method may simply be repeated a given or predetermined number of times.

Notice that the method may alternate between forming thinner layers of the first material over the first region and reducing encroachment of the thinner layers of the first material over the adjacent second region. As mentioned elsewhere herein, forming thinner layers represents one approach for limiting encroachment, since the amount of encroachment generally tends to increase with increasing layer thickness. Moreover, reducing encroachment on each of these thinner layers may help to drive back the amount of encroachment on each layer so that the amount of encroachment does not continue to progressively increase as additional thinner layers are deposited. This represents another embodiment of a suitable approach for limiting encroachment.

Figure 8C:
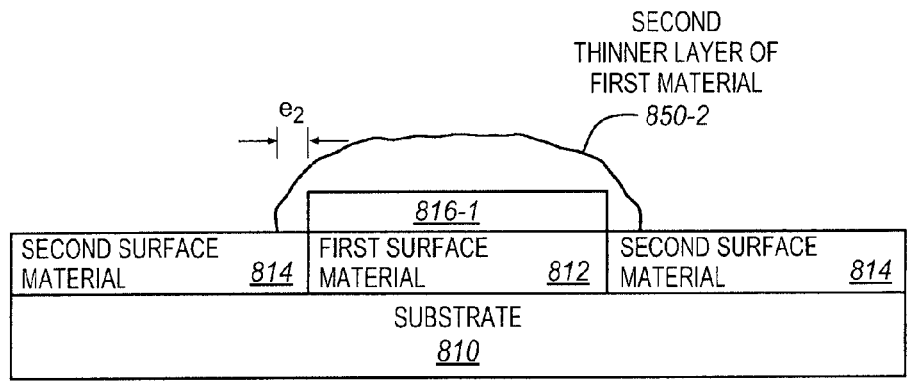
Figure 8D:
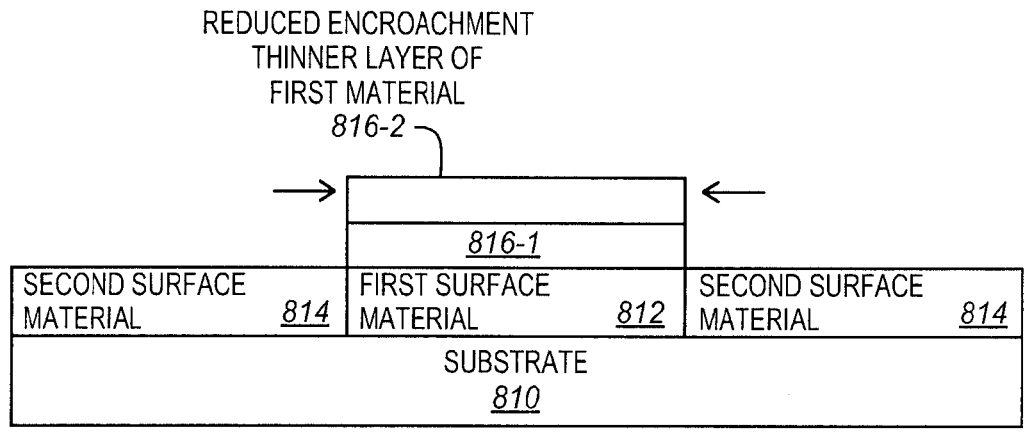

FIG. 8C shows a second thinner layer of the first material 850-2 selectively formed over the first reduced encroachment thinner layer of the first material 816-1 by selective or at least preferential chemical reaction. FIG. 8D shows a second modified reduced encroachment thinner layer of the first material 816-2 formed by reducing the encroachment of the layer 850-2. As before, the amount of encroachment may be reduced a little or a lot, as desired for the particular implementation.

Referring again to block 742 of FIG. 7, at some point, the cumulative thicker layer of the first material will reach a sufficient thickness. The method may advance from block 742 to block 743. At block 743, a second thicker layer of a second material may be formed over the adjacent second region having the second different surface material. In some embodiments, the second thicker layer may be formed by as a single layer through a single deposition. In some embodiments, the second thicker layer may be formed by blanket depositing or back filling the second material over the top surface of the substrate and between the thicker layers of the first material in a single deposition procedure. In various embodiments, the second thicker layer may be formed by depositing the second material by ALD, CVD, sol-gel, solution-based spin-on approach, or other approaches known in the arts. For example, in the case that the second material is a dielectric material, any of the various dielectric materials disclosed elsewhere herein may be deposited by CVD, ALD, MLD, sol-gel, or spin-on processes known in the arts. There is no need for a selective or preferential chemical reaction, since the thicker layers of the first material have already been formed. In other embodiments, the second thicker layer may be formed by selective or at least preferential chemical reaction using the various approaches disclosed elsewhere herein.

Figure 8E:
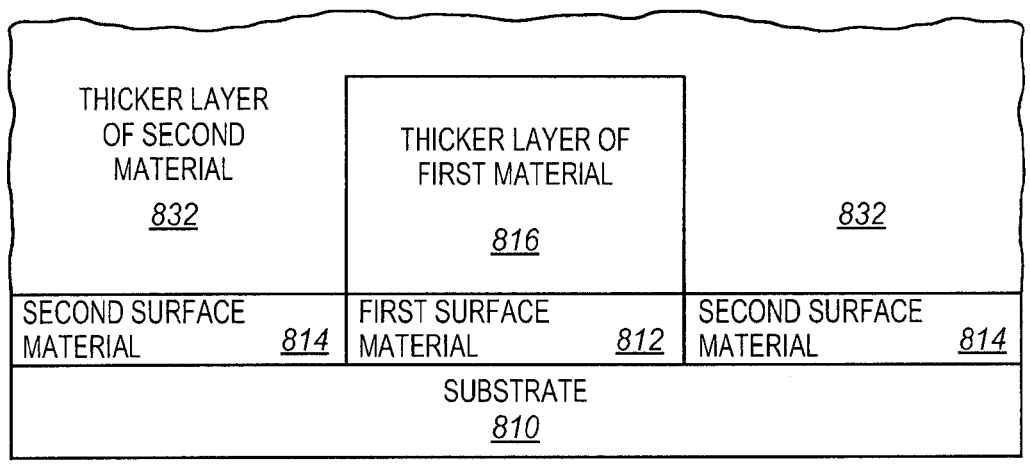

FIG. 8E shows a thicker layer of a second material 832 formed over the second regions and/or the second surface material 814 and over the tops of the thicker layers of the first material 816. Any of the aforementioned approaches may be used to form this layer. In some embodiments, CMP or other planarization approaches may optionally be used to generally planarize the surface and expose the tops of the thicker layers of the first material, although this is not required.

In other embodiments, carbon nanotubes may be grown relatively selectively above metal surfaces using an approach similar to that shown in FIG. 7 and FIG. 8A-8E. However, often the carbon nanotubes are able to grow with limited amounts of encroachment such that there is no need to intermittently reduce the amount of encroachment by performing a trim etch or the like.

Figure 9A:
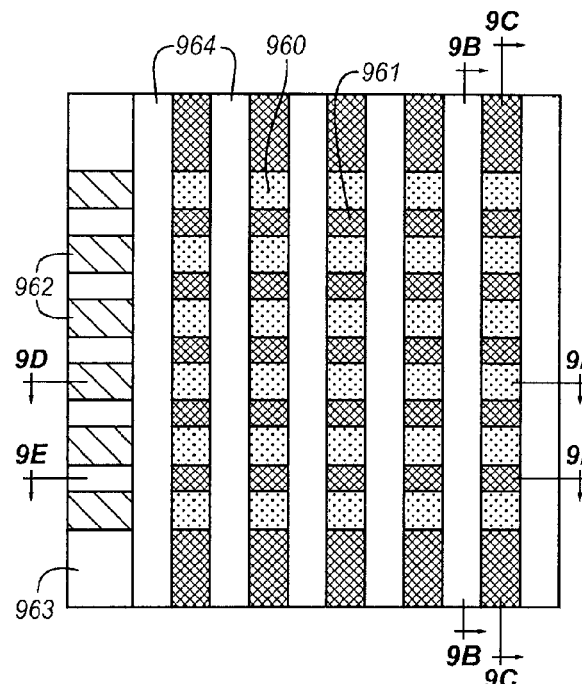
FIGS. 9A-9E illustrate different views of an embodiment an intermediate substrate produced during an embodiment of a via formation process.
Figure 9B:
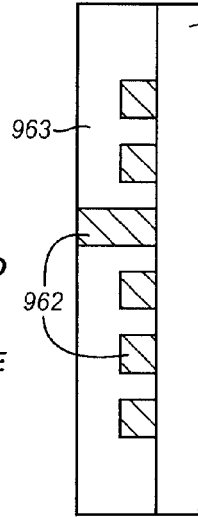
Figure 9C:
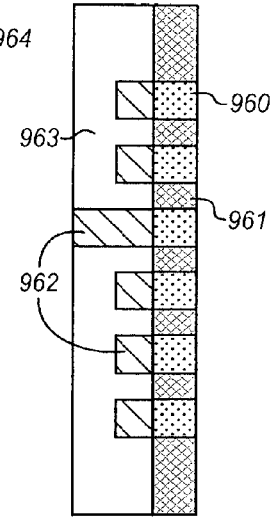
Figure 9D:
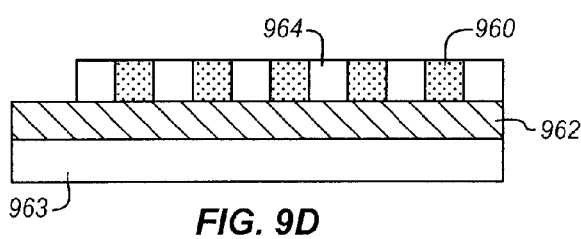
Figure 9E:
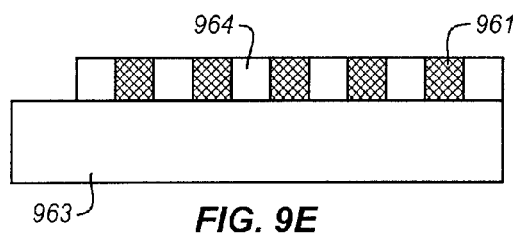

FIGS. 9A-9E illustrate different views of an embodiment an intermediate substrate produced during an embodiment of a via formation process in which a two dimensional array of alternating thicker layers of metal 960 and dielectric material 961 are formed over an underlying metal line 962 and ILD 963 grid between raised ILD line structures 964 of an upper level ILD grating. FIG. 9A is a top planar view. FIG. 9B is a cross-sectional side view taken along section line 9B-9B through a raised ILD line structure 964 of the upper level ILD grating. FIG. 9C is a cross-sectional side view taken along section line 9C-9C through alternating thicker layers of metal 960 and dielectric material 961 between adjacent raised ILD line structures 964 of the upper level ILD grating. FIG. 9D is a cross-sectional side view taken along section line 9D-9D taken transverse through thicker layers of metal 960 and adjacent raised ILD line structures 964 of the upper level ILD grating. FIG. 9E is a cross-sectional side view taken along section line 9E-9E taken transverse through thicker layers of dielectric material 961 and adjacent raised ILD line structures 964 of the upper level ILD grating.

As can be seen, six parallel vertical raised ILD line structures 964 represent an upper level ILD grating. The six vertical raised ILD line structures overly a metal line 962 and ILD 963 grid having six parallel horizontal metal lines 962 disposed or embedded within ILD 963 revealing the tops of six parallel ILD line structures 963 each between a different pair of adjacent metal lines 962. The vertical upper level raised ILD line structures 964 are perpendicular to the underlying horizontal metal 962 and ILD 963 grid. As well shown in FIG. 9A and FIG. 9C, one dimensional arrays or columns of alternating thicker layers of metal 960 and dielectric material 961 are formed over an underlying metal line 962 and ILD 963 grid between raised vertical ILD line structures 964. The thicker layers of the metal 960 and dielectric material 961 basically extend the underlying metal 962 and ILD 963 upward between the raised vertical ILD line structures. The thicker layers of the metal 960 are surrounded on all sides, except for their bottoms and exposed tops, by insulating material (e.g., the raised vertical ILD line structures 964 and the thicker layers of dielectric material 961.

The thicker layers of the metal 960 have been formed non-selectively over all underlying exposed metal surfaces (e.g., at all possible via positions). As mentioned, these thicker layers of metal may be used as vias, and in the illustrated embodiment these thicker layers of metal have been formed in all possible via locations surrounded by dielectric material. Only some of these thicker layers of metal 960 will generally be needed for vias, whereas others will not be needed for use as vias. In some embodiments, a subset of these thicker layers of metal 960 not needed for vias may be selectively removed, while leaving another portion that are intended to be used as vias. Representatively, if needed, a chemical mechanical planarization (CMP) or other suitable surface planarization technique may optionally be used to planarize the surface of the substrate.

Lithography with or without the deposition of additional hard mask gratings may then be performed to define which vias are to be removed, for example by a subtractive metal etch. For example, a photoresist layer may be lithographically patterned such that a portion remains over a first subset of the thicker layers of metal 960 intended to be used as vias, and another portion is removed to reveal an etch access opening over a second subset of the thicker layers of metal 960 not needed for vias. Then, an etch may be performed through the etch access opening to selectively remove the second subset of the thicker layers of metal 960. Dielectric material may then be backfilled or otherwise introduced into the openings formed by removing the unwanted vias. Examples of suitable approaches for depositing or introducing the dielectric include, but are not limited to, solution-based spin-on approaches, CVD, ALD, and the like. An optional CMP or other planarization technique may then be applied to planarize the surface and reveal the ends of the vias.

In some embodiments, the layers formed as disclosed herein may be used to form extremely small structures (e.g., vias) and/or structures at extremely small pitches. For example, in some embodiments, the assembled structures may be used to form vias having critical dimensions of about 20 nm or less and/or vias at pitches of about 50 nm or less. For example, vias having cross-sectional dimensions of no more than about 20 nm may be formed over an interconnect line having a line width of no more than about 20 nm. Such extremely small structures and/or pitches generally tend to present challenges for lithography. Advantageously, since the layers of materials are substantially aligned relative to the different underlying material patterns, the vias or interconnect structures may also be aligned or positioned relative to the different underlying material pattern boundaries. That is, there may be so-called "bottoms up" formation of the layers of materials and/or the interconnect structures. This may help to improve alignment, without needing to rely on lithography for such alignment (e.g., a "top down" approach), especially when forming extremely small structures or structures at extremely small pitches. Other embodiments are not limited to such small sizes and/or pitches.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
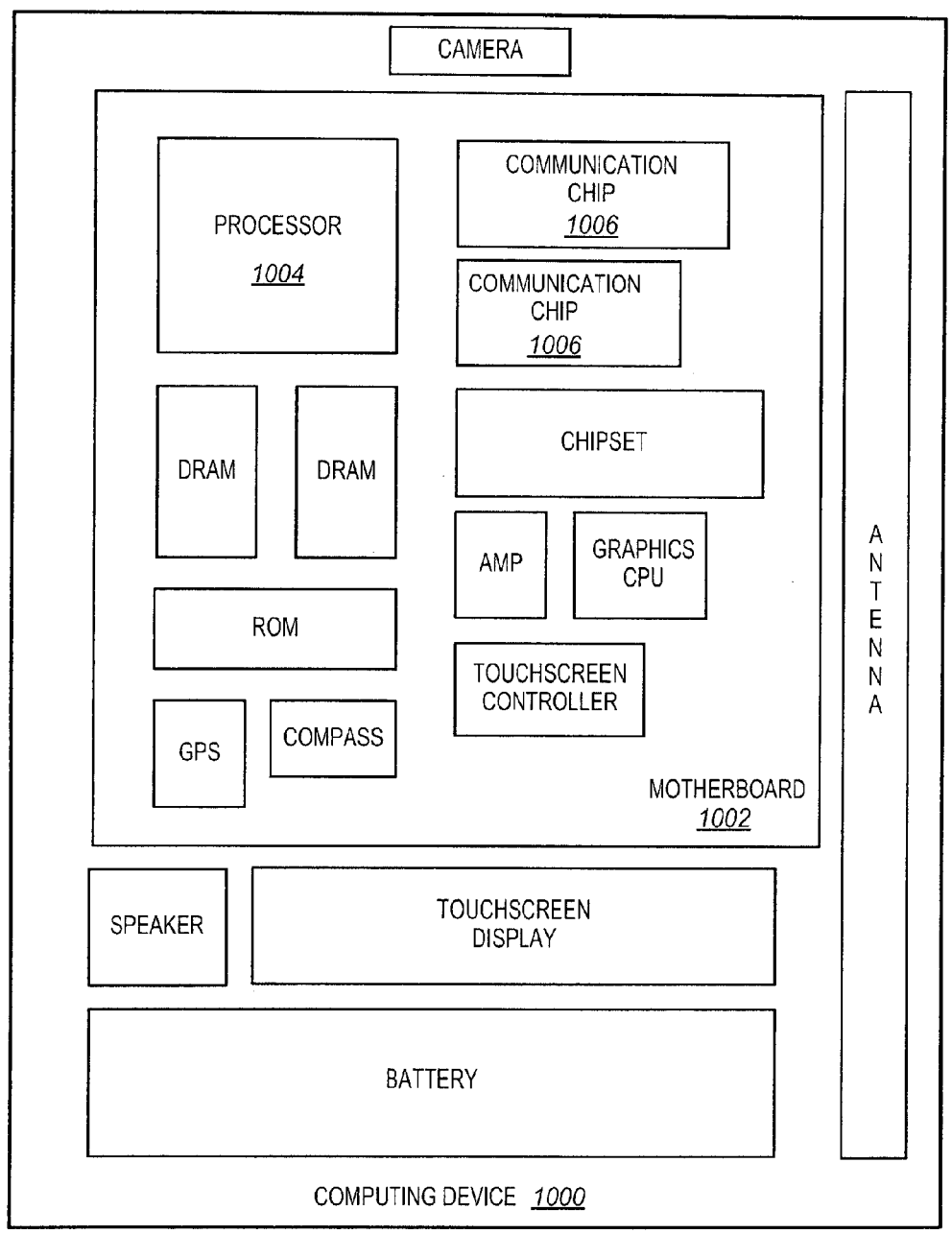
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more structures, such as self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more structures, such as self-aligned vias and plugs, built in accordance with implementations of the invention.

In further implementations, another component housed within the computing device 1000 may contain an integrated circuit die that includes one or more structures, such as self-aligned vias and plugs, built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Embodiments have been described in detail in the context of forming vias for integrated circuits, although the scope of the invention is not so limited. Other embodiments pertain to forming other types of structures for memory devices, photodiode arrays, microelectromagnetic systems (MEMS), or other types of devices. Embodiments have been described in detail for two different types of underlying materials (e.g., a metal and a dielectric). However, in other embodiments, three or more different types of underlying materials may optionally be used.

It is to be appreciated that the various approaches disclosed herein may be used in various other combinations than those explicitly shown. Components, features, and optional details described herein for any of the substrates may also optionally apply to the associated methods described herein. For example, components, features, and details described for any of FIGS. 3A-3E and/or FIGS. 4A-4C and/or FIGS. 5A-5E and/or FIGS. 6A-6C may also optionally be used in the methods of FIG. 1 and/or FIG. 2. Likewise, components, features, and details described for any of FIGS. 8A-8E may also optionally be used in the method of FIG. 1 and/or FIG. 7. Also, components, features, and details described for FIG. 9 may also optionally be used in the method of any of FIG. 1 and/or FIG. 2 and/or FIG. 7. Still further, reducing encroachment (e.g., using a trim etch, annealing treatment, etc.) may be used with other embodiments disclosed herein besides those explicitly shown (e.g., the method of FIG. 2).

In the description and claims, the terms "coupled" and "connected," along with their derivatives, may be used herein. These terms are not intended as synonyms for each other. Rather, in particular embodiments, "connected" may be used to indicate that two or more elements are in direct physical and/or electrical contact with each other. "Coupled" may mean that two or more elements are in direct physical or electrical contact with each other. However, "coupled" may also mean that two or more elements are not in direct contact with each other. Similarly, a first element "over" (or "under") a second element may refer to either the first element directly "on" the second element (or the second element directly "on" the first element), or there may be one or more intervening elements disposed between the first and second elements.

The term "and/or" may have been used. As used herein, the term "and/or" means one or the other or both (e.g., A and/or B means A or B or both A and B).

In the description above, for purposes of explanation, numerous specific details have been set forth in order to provide a thorough understanding of embodiments of the invention. It will be apparent however, to one skilled in the art, that one or more other embodiments may be practiced without some of these specific details. The particular embodiments described are not provided to limit the invention but to illustrate it through example embodiments. The scope of the invention is not to be determined by the specific examples but only by the claims. In other instances, well-known structures, elements, and operations have been shown in block diagram form or without detail in order to avoid obscuring the understanding of the description.

Where considered appropriate, reference numerals, or terminal portions of reference numerals, have been repeated among the figures to indicate corresponding or analogous elements, which may optionally have similar or the same characteristics, unless specified or clearly apparent otherwise.

Various operations and methods have been described. Some of the methods have been described in a relatively basic form in the flow diagrams, but operations may optionally be added to and/or removed from the methods. In addition, while the flow diagrams show a particular order of the operations according to example embodiments, that particular order is exemplary. Alternate embodiments may optionally perform the operations in different order, combine certain operations, overlap certain operations, etc.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

EXAMPLE EMBODIMENTS

The following examples pertain to further embodiments. Specifics in the examples may be used anywhere in one or more embodiments.

Example 1 is a method including forming a first thicker layer of a first material over a first region having a first surface material by separately forming each of a first plurality of thinner layers by selective chemical reaction. The method also includes limiting encroachment of each of the first plurality of thinner layers over a second region that is adjacent to the first region. The method further includes forming a second thicker layer of a second material over the second region having a second surface material that is different than the first surface material.

Example 2 includes the method of Example 1, in which forming the second thicker layer includes forming the second thicker layer by separately forming each of a second plurality of thinner layers by selective chemical reaction.

Example 3 includes the method of Example 2, in which limiting the encroachment includes alternating between forming the thinner layers of the first and second pluralities of thinner layers.

Example 4 includes the method of Example 3, in which limiting the encroachment includes forming each of the thinner layers of the first plurality of thinner layers to a thickness of no more than 4 nm to provide only limited encroachment over the second region. Each of the thinner layers of the second plurality of thinner layers is formed to a thickness of no more than 4 nm to provide only limited encroachment over the first region.

Example 5 includes the method of Example 3, in which limiting the encroachment includes forming an initial thinner layer of the first and second pluralities of thinner layers of one of the first and second materials that provides a least amount of lateral encroachment per layer thickness.

Example 6 includes the method of any of Examples 3 to 5, in which forming the first thicker layer includes forming at least five thinner layers of the first plurality of thinner layers. Also, forming the second thicker layer includes forming at least five thinner layers of the second plurality of thinner layers.

Example 7 includes the method of any of Examples 3 to 5, in which forming the first thicker layer includes forming the first thicker layer of an organic polymeric material over the first region having the first surface material by separately forming each of the first plurality of thinner layers by selective polymerization reaction. One of the first and second surface materials is a metal and another is a dielectric material.

Example 8 includes the method of Example 7, in which forming the first thicker layer includes forming the first thicker layer of the organic polymeric material over the first region having a metal as the first surface material. The method further includes removing the first thicker layer of the organic polymeric material from over the first region, and introducing a metal over the first region where the first thicker layer of the organic polymeric material was removed.

Example 9 includes the method of Example 7, in which forming the first thicker layer includes forming the first thicker layer of the organic polymeric material over the first region having a dielectric material as the first surface material. The method further includes removing the first thicker layer of the organic polymeric material from over the first region, and introducing a dielectric material over the first region where the first thicker layer of the organic polymeric material was removed.

Example 10 includes the method of Example 1, in which limiting the encroachment includes alternating between forming the thinner layers of the first plurality of thinner layers and reducing the encroachment of the thinner layers of the first plurality of thinner layers.

Example 11 includes the method of Example 10, in which reducing the encroachment includes performing trim etches on the thinner layers.

Example 12 includes the method of Example 10, in which reducing the encroachment includes performing at least one of anneals, thermal treatments, and recrystallization treatments on the thinner layers.

Example 13 includes the method of any of Examples 10 to 12, in which forming the second thicker layer includes depositing a single thick layer of the second material over the second region.

Example 14 includes the method of any of Examples 1 to 13, in which a maximum lateral cross-sectional dimension of the first region is no more than 50 nm, and in which the first thicker layer has a thickness of at least 10 nm.

Example 15 includes the method of any of Examples 1 to 13, in which forming the first thicker layer includes forming at least five thinner layers of the first plurality of thinner layers.

Example 16 includes the method of any of Examples 1 to 6 and 10 to 15, in which forming the first thicker layer includes forming the first thicker layer of the first material that is one of a metal and a sacrificial organic polymeric material over the first region having a metal as the first surface material. Forming the second thicker layer includes forming the second thicker layer of a dielectric material over the second region having a dielectric material as the second surface material.

Example 17 includes the method of any of Examples 1 to 6 and 10 to 15, in which forming the first thicker layer includes forming the first thicker layer of a metal as the first material over the first region having a metal as the first surface material. Forming the second thicker layer includes forming the second thicker layer of a second material that is one of a dielectric material and a sacrificial organic polymeric material over the second region having a dielectric material as the second surface material.

Example 18 includes the method of any of Examples 1 to 17, in which limiting the encroachment includes reducing the encroachment of a given thinner layer of the first plurality of thinner layers by performing at least one of a trim etch, an anneal, a thermal treatment, and a recrystallization treatment on the given thinner layer.

Example 19 is a method including forming a first thicker layer of a first material over a first region having a first surface material by separately forming each of at least five thinner layers by selective chemical reaction. A maximum lateral cross-sectional dimension of the first region is no more than 50 nm. The first thicker layer has a thickness of at least 10 nm. The method also includes limiting encroachment of each of the first plurality of thinner layers over a second region that is adjacent to the first region. The method further includes forming a second thicker layer of a second material over the second region having a second surface material that is different than the first surface material. One of the first and second surface materials is a metal and another is a dielectric material.

Example 20 includes the method of Example 19, in which forming the second thicker layer includes forming the second thicker layer by separately forming each of a second plurality of thinner layers by selective chemical reaction. Limiting the encroachment includes alternating between forming the thinner layers of the first and second pluralities of thinner layers.

Example 21 includes the method of any of Examples 19 to 20, in which limiting the encroachment includes alternating between forming the thinner layers of the first plurality of thinner layers and reducing the encroachment of the thinner layers of the first plurality of thinner layers. Reducing the encroachment includes performing at least one of trim etches, anneals, thermal treatments, and recrystallization treatments on the thinner layers.

Example 22 includes the method of any of Examples 19 to 20, in which limiting the encroachment includes reducing the encroachment of at least one thinner layer of the first plurality of thinner layers by performing at least one of a trim etch, an anneal, a thermal treatment, and a recrystallization treatment on the at least one thinner layer.

Example 23 is an integrated circuit including a dielectric material, an interconnect line disposed within the dielectric material, and a via over the interconnect line. A cross-sectional dimension of the via is no more than 30 nm. A dielectric material laterally surrounds the via and includes a portion adjacent to the via. At least one of (a) the via includes at least five thinner layers vertically stacked on one another, and (b) the portion of the dielectric material adjacent to the via includes at least five thinner layers vertically stacked on one another.

Example 24 includes the integrated circuit of Example 23, in which the via includes the at least five thinner layers vertically stacked on one another, and in which each of the thinner layers of the via has a thickness of no more than 4 nm.

Example 25 includes the integrated circuit of Example 24, in which the via includes at least seven thinner layers vertically stacked on one another, and in which each of the thinner layers of the via has a thickness between 0.5 nm and 3 nm.

Example 26 includes the integrated circuit of Example 23, in which the portion of the dielectric material adjacent to the via includes the at least five thinner layers vertically stacked on one another. Each of the thinner layers of the portion of the dielectric material has a thickness of no more than 4 nm.

Example 27 includes the integrated circuit of Example 26, in which the portion of the dielectric material adjacent to the via includes at least seven thinner layers vertically stacked on one another. Each of the thinner layers of the portion of the dielectric material has a thickness thickness between 0.5 nm and 3 nm.

Example 28 includes the integrated circuit of any of Examples 23 to 27, in which both the via includes the at least five thinner layers vertically stacked on one another and also the portion of the dielectric material adjacent to the via includes the at least five thinner layers vertically stacked on one another. Each thinner layer of the via and each thinner layer of the portion of the dielectric material has a thickness between 0.5 nm and 4 nm.

Example 29 includes the integrated circuit of Example 28, in which top surfaces of thinner layers of the via and the portion of the dielectric layer are grown above one another by thicknesses of at least 0.5 nm.

Example 30 includes an integrated circuit substrate or other apparatus manufactured by the method of any of Examples 1 to 18.

Example 31 includes a manufacturing system to perform the method of any of Examples 1 to 18.

Example 32 includes a manufacturing system including means for performing the method of any of Examples 1 to 18.

Example 33 includes an integrated circuit substrate or other apparatus manufactured by the method of any of Examples 19 to 22.

Example 34 includes a manufacturing system to perform the method of any of Examples 19 to 22.

Example 35 includes a manufacturing system including means for performing the method of any of Examples 19 to 22.

Example 36 includes the method of any of Examples 1 to 18 in which forming the first thicker layer of the first material comprises applying a voltage bias to the first surface material while forming at least one thinner layer of the first plurality of thinner layers. The voltage bias help to increase selectivity of the selective chemical reaction.

Example 37 includes the method of Example 36 in which the at least one thinner layer comprises a metal layer, and wherein voltage bias is applied as a radio frequency alternating current voltage bias.

What is claimed is:
1. A manufacturing method comprising:
   forming a first thicker layer of a first material over a first region having a first surface material by separately forming each of a first plurality of thinner layers by selective chemical reaction;
   limiting encroachment of each of the first plurality of thinner layers over a second region that is adjacent to the first region; and
   forming a second thicker layer of a second material over the second region having a second surface material that is different than the first surface material.

2. The method of claim 1, wherein forming the second thicker layer comprises forming the second thicker layer by separately forming each of a second plurality of thinner layers by selective chemical reaction.

3. The method of claim 2, wherein limiting the encroachment comprises alternating between forming the thinner layers of the first and second pluralities of thinner layers.

4. The method of claim 3, wherein limiting the encroachment comprises:
   forming each of the thinner layers of the first plurality of thinner layers to a thickness of no more than 4 nm to provide only limited encroachment over the second region; and
   forming each of the thinner layers of the second plurality of thinner layers to a thickness of no more than 4 nm to provide only limited encroachment over the first region.

5. The method of claim 3, wherein limiting the encroachment comprises forming an initial thinner layer of the first and second pluralities of thinner layers of one of the first and second materials that provides a least amount of lateral encroachment per layer thickness.

6. The method of claim 3, wherein forming the first thicker layer comprises forming at least five thinner layers of the first plurality of thinner layers, and wherein forming the second thicker layer comprises forming at least five thinner layers of the second plurality of thinner layers.

7. The method of claim 3, wherein forming the first thicker layer comprises forming the first thicker layer of an organic polymeric material over the first region having the first surface material by separately forming each of the first plurality of thinner layers by selective polymerization reaction, wherein one of the first and second surface materials is a metal and another is a dielectric material.

8. The method of claim 7, wherein forming the first thicker layer comprises forming the first thicker layer of the organic polymeric material over the first region having a metal as the first surface material, and further comprising:
   removing the first thicker layer of the organic polymeric material from over the first region; and
   introducing a metal over the first region where the first thicker layer of the organic polymeric material was removed.

9. The method of claim 7, wherein forming the first thicker layer comprises forming the first thicker layer of the organic polymeric material over the first region having a dielectric material as the first surface material, and further comprising:
   removing the first thicker layer of the organic polymeric material from over the first region; and
   introducing a dielectric material over the first region where the first thicker layer of the organic polymeric material was removed.

10. The method of claim 1, wherein limiting the encroachment comprises alternating between forming the thinner layers of the first plurality of thinner layers and reducing the encroachment of the thinner layers of the first plurality of thinner layers.

11. The method of claim 10, wherein reducing the encroachment comprises performing trim etches on the thinner layers.

12. The method of claim 10, wherein reducing the encroachment comprises performing at least one of anneals, thermal treatments, and recrystallization treatments on the thinner layers.

13. The method of claim 1, wherein a maximum lateral cross-sectional dimension of the first region is no more than 50 nm, and wherein the first thicker layer has a thickness of at least 10 nm, and wherein forming the first thicker layer comprises forming at least five thinner layers of the first plurality of thinner layers.

14. A manufacturing method comprising:
   forming a first thicker layer of a first material over a first region having a first surface material by separately forming each of at least five thinner layers by selective chemical reaction, wherein a maximum lateral cross-sectional dimension of the first region is no more than 50 nm, and wherein the first thicker layer has a thickness of at least 10 nm;

limiting encroachment of each of the first plurality of thinner layers over a second region that is adjacent to the first region; and forming a second thicker layer of a second material over the second region having a second surface material that is different than the first surface material, wherein one of the first and second surface materials is a metal and another is a dielectric material.

15. The method of claim 14, wherein forming the second thicker layer comprises forming the second thicker layer by separately forming each of a second plurality of thinner layers by selective chemical reaction, and wherein limiting the encroachment comprises alternating between forming the thinner layers of the first and second pluralities of thinner layers.

16. The method of claim 14, wherein limiting the encroachment comprises alternating between forming the thinner layers of the first plurality of thinner layers and reducing the encroachment of the thinner layers of the first plurality of thinner layers, wherein reducing the encroachment comprises performing at least one of trim etches, anneals, thermal treatments, and recrystallization treatments on the thinner layers.

17. An integrated circuit comprising:
a dielectric material;
an interconnect line disposed within the dielectric material;
a via over the interconnect line, wherein a cross-sectional dimension of the via is no more than 30 nm; and
a dielectric material laterally surrounding the via and including a portion adjacent to the via,
wherein at least one of:
the via includes at least five thinner layers vertically stacked on one another; and
the portion of the dielectric material adjacent to the via includes at least five thinner layers vertically stacked on one another.

18. The integrated circuit of claim 17, wherein the via includes the at least five thinner layers vertically stacked on one another, and wherein each of the thinner layers of the via has a thickness of no more than 4 nm.

19. The integrated circuit of claim 18, wherein the via includes at least seven thinner layers vertically stacked on one another, and wherein each of the thinner layers of the via has a thickness between 0.5 nm and 3 nm.

20. The integrated circuit of claim 17, wherein the portion of the dielectric material adjacent to the via includes the at least five thinner layers vertically stacked on one another, and wherein each of the thinner layers of the portion of the dielectric material has a thickness of no more than 4 nm.

* * * * *